United States Patent
Cecil

(10) Patent No.: US 10,262,100 B2
(45) Date of Patent: Apr. 16, 2019

(54) RULE BASED ASSIST FEATURE PLACEMENT USING SKELETONS

(71) Applicant: Synopsys, Inc., Mountain View, CA (US)

(72) Inventor: Thomas C. Cecil, Menlo Park, CA (US)

(73) Assignee: Synopsys, Inc., Mountain View, CA (US)

( * ) Notice: Subject to any disclaimer, the term of this patent is extended or adjusted under 35 U.S.C. 154(b) by 65 days.

(21) Appl. No.: 15/604,560

(22) Filed: May 24, 2017

(65) Prior Publication Data

US 2018/0341740 A1 Nov. 29, 2018

(51) Int. Cl.
G06F 17/50 (2006.01)
G03F 1/24 (2012.01)

(52) U.S. Cl.
CPC .......... G06F 17/5081 (2013.01); G03F 1/24 (2013.01)

(58) Field of Classification Search
CPC .................. G06F 17/5031; G06F 17/5054
USPC .......................................................... 716/55
See application file for complete search history.

(56) References Cited

U.S. PATENT DOCUMENTS

| | | | |
|---|---|---|---|
| 5,821,014 A | 10/1998 | Chen et al. | |
| 6,303,253 B1 * | 10/2001 | Lu ............................ | G03F 1/36 430/5 |
| 7,001,693 B2 | 2/2006 | Liebmann et al. | |
| 7,115,343 B2 | 10/2006 | Gordon et al. | |
| 7,620,930 B2 * | 11/2009 | Van Den Broeke ........ | G03F 7/70441 430/30 |
| 8,082,525 B2 * | 12/2011 | Liu ............................ | G03F 1/36 378/35 |
| 9,754,068 B2 * | 9/2017 | Lutich ...................... | G03F 1/36 |
| 2005/0153212 A1 * | 7/2005 | Lavin ........................ | G03F 1/36 430/5 |
| 2006/0075377 A1 * | 4/2006 | Broeke ...................... | G03F 1/36 716/53 |
| 2007/0028200 A1 * | 2/2007 | Blatchford ............ | G06F 17/5068 257/797 |
| 2009/0258302 A1 * | 10/2009 | Ho ............................ | G03F 1/36 430/5 |
| 2009/0293037 A1 * | 11/2009 | Liu ............................ | G03F 1/36 716/55 |
| 2011/0173578 A1 * | 7/2011 | Tsai .......................... | G03F 1/36 716/55 |

(Continued)

*Primary Examiner* — Stacy Whitmore
(74) *Attorney, Agent, or Firm* — Bever, Hoffman & Harms, LLP

(57) ABSTRACT

A method for generating sub-resolution assist features (SRAFs) for target features of a photomask includes generating a 2D rules-based assist feature (RBAF) rules table that estimates results obtained from a model-based SRAF method. The 2D RBAF rules table defines seed skeletons using polar coordinates. Empty space surrounding the target features is divided into corresponding owned regions. Seed skeletons are placed in the owned regions using the 2D RBAF rules table. The seed skeletons are widened, and the resulting structure is re-skeletonized. A cleaning process is performed on the re-skeletonized structure, eliminating potentially troublesome features, including stubs, forks, triple-points and quad-points. The cleaned skeleton structure is straightened, and polygonal SRAFs are placed at locations specified by the straightened skeleton structure.

23 Claims, 25 Drawing Sheets

(56) References Cited

U.S. PATENT DOCUMENTS

| | | | | |
|---|---|---|---|---|
| 2011/0202892 A1* | 8/2011 | Lee | ............................ | G03F 1/36 |
| | | | | 716/53 |
| 2015/0356234 A1* | 12/2015 | Chen | ........................ | G03F 1/144 |
| | | | | 716/52 |
| 2016/0162623 A1* | 6/2016 | Lutich | ........................ | G03F 1/36 |
| | | | | 716/51 |
| 2017/0329886 A1* | 11/2017 | Lutich | ........................ | G03F 1/36 |
| 2017/0371250 A1* | 12/2017 | Kim | ............................ | G03F 1/26 |
| 2018/0239861 A1* | 8/2018 | Chen | ........................ | G03F 1/144 |

* cited by examiner

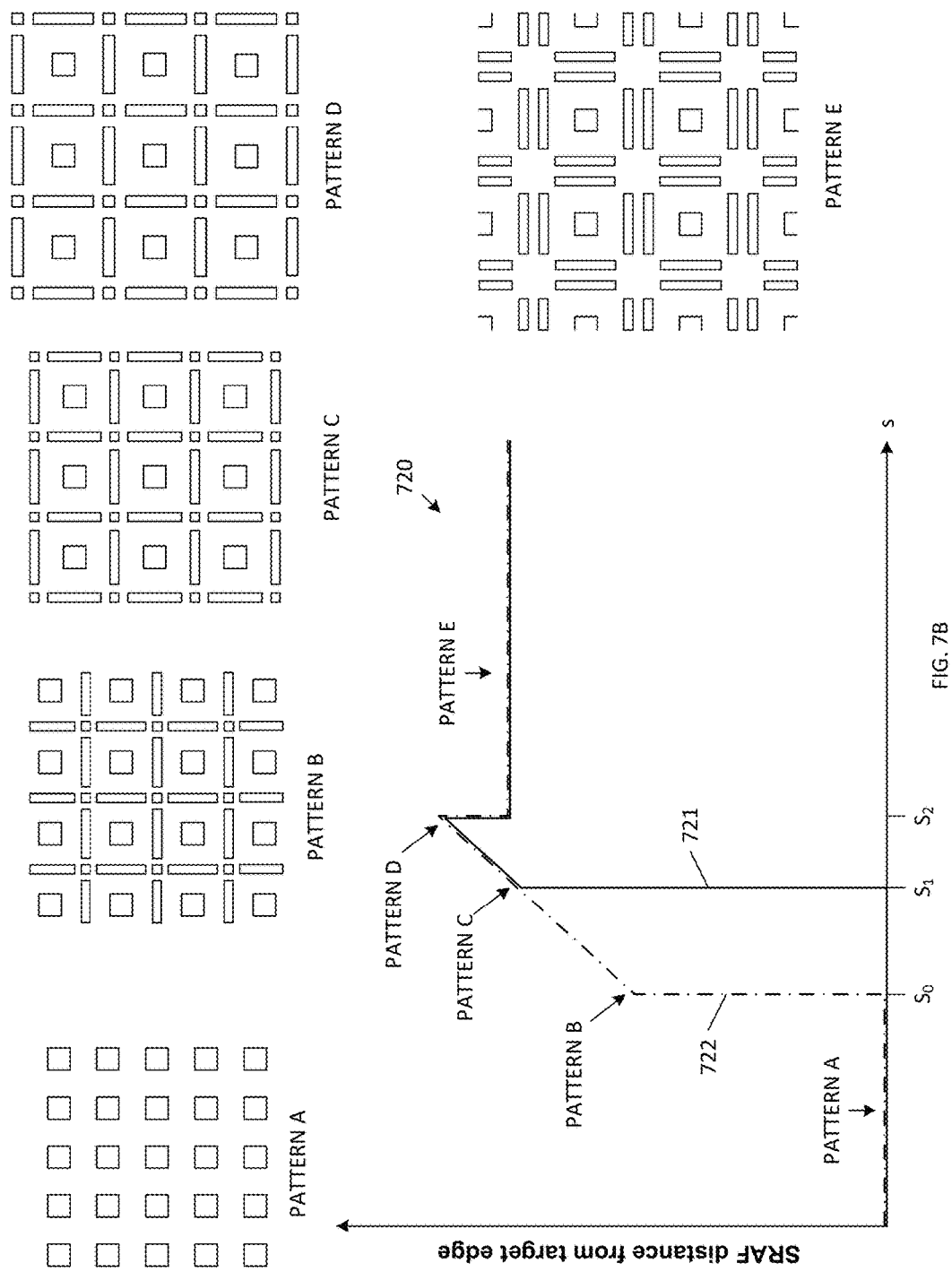

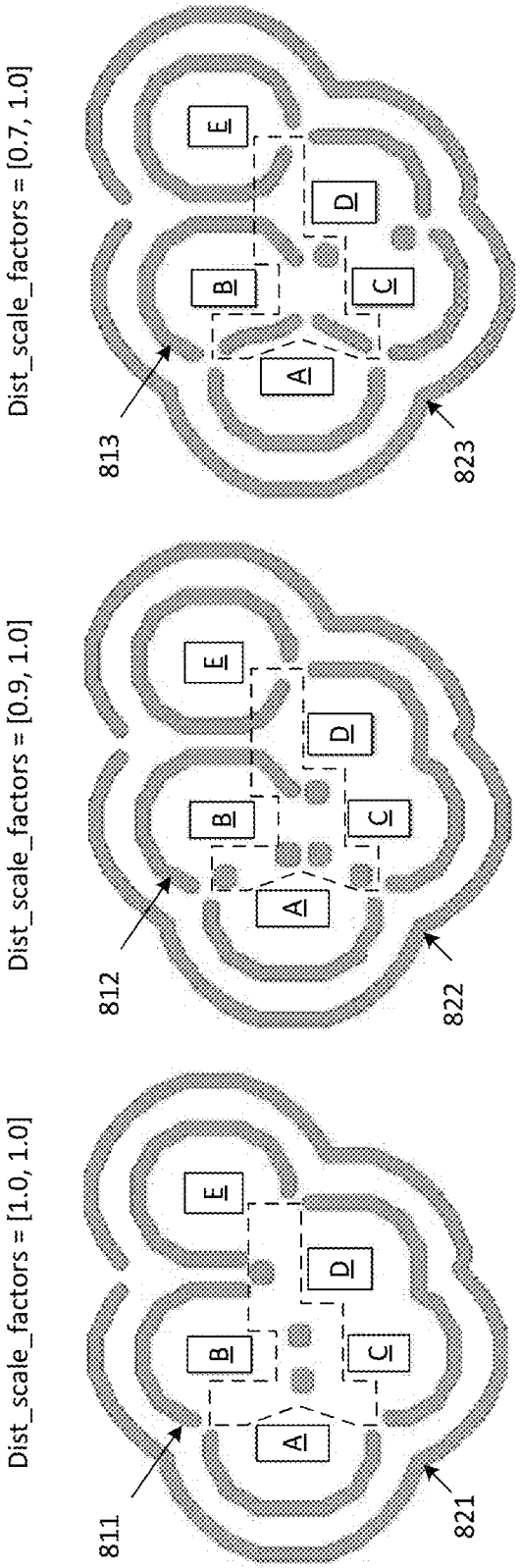

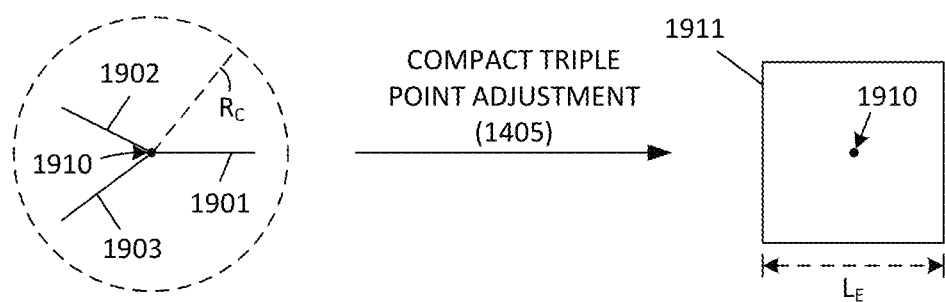
FIG. 19
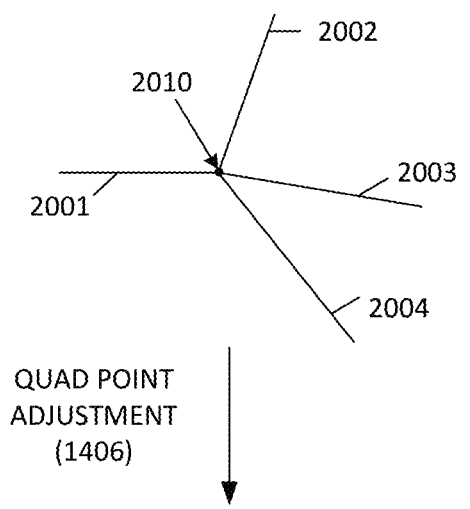
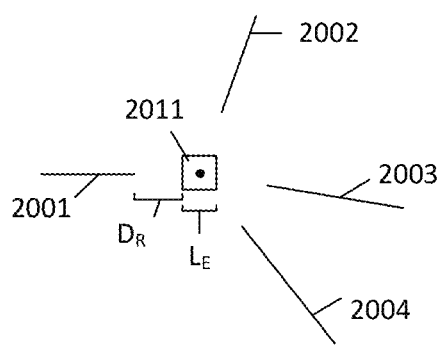
FIG. 20

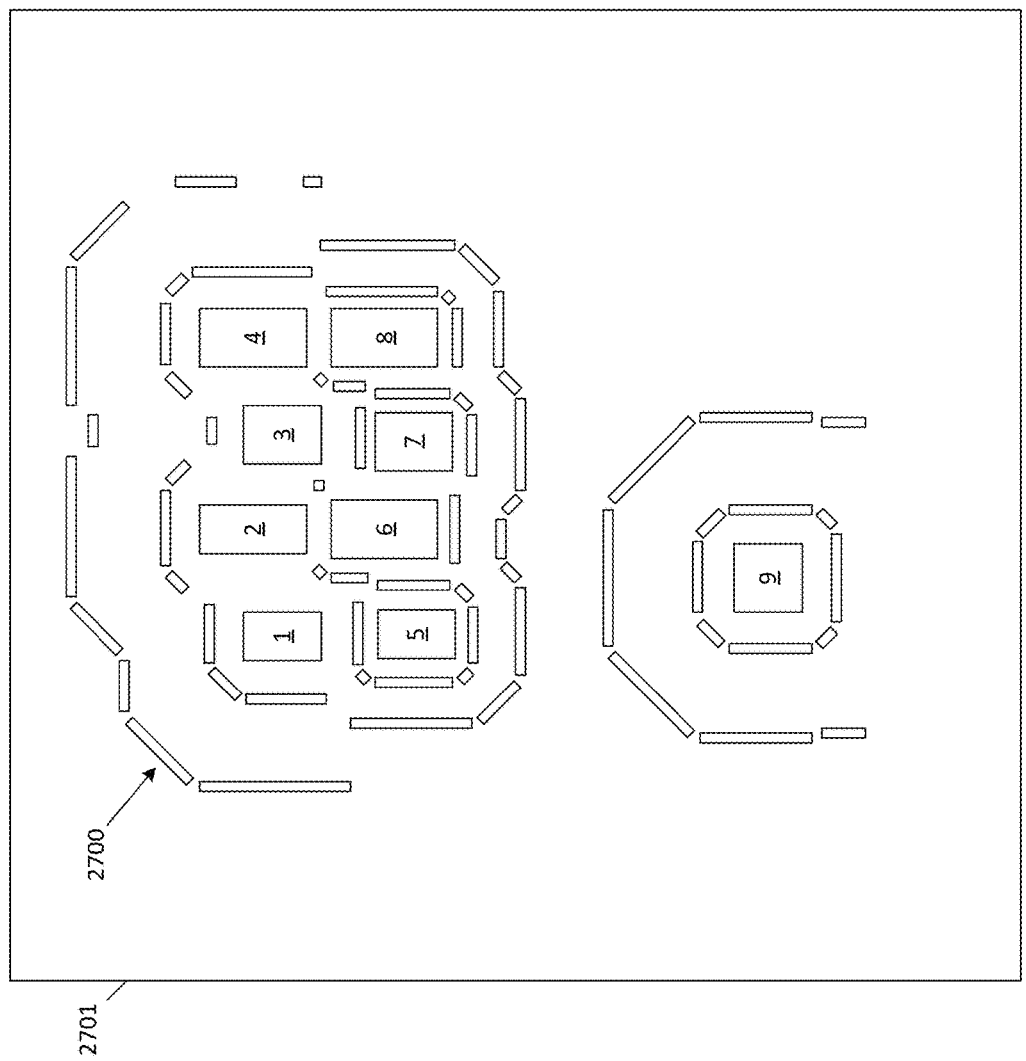

RULE BASED ASSIST FEATURE
PLACEMENT USING SKELETONS

FIELD OF THE INVENTION

The present invention relates to methods for determining the placement of sub-resolution assist features (SRAFs) on a photolithography mask.

RELATED ART

In conventional semiconductor processing, photoresist masks are used to define the patterns of various layers of a semiconductor device. Photoresist masks are formed by depositing a layer of photosensitive material (i.e., photoresist) over a semiconductor structure, exposing the photoresist layer to an illumination source through a patterned photolithography mask ("photomask"), and then removing the unexposed (or exposed) portions of the photoresist layer. Material exposed through the photomask (e.g., metal) can be etched, thereby transferring the pattern on the photomask to the semiconductor device. As the patterns to be formed on the photoresist layer become smaller (i.e., have smaller critical dimensions) and more complicated, it becomes more difficult to optically transfer a pattern from a photomask to the layer of photoresist material. More specifically, interference and other processing effects can result in undesired deviations between in the desired pattern and the actual pattern transferred to the photoresist material. These undesired deviations can significantly affect the performance of the resulting semiconductor device. In order to minimize these deviations, various compensation schemes have been implemented, including modifying the patterns provided on the photomask using optical proximity correction (OPC) methods. One conventional compensation scheme involves adding sub-resolution assist features (SRAFs) to the pattern of the photomask. SRAFs are placed adjacent to target features of the photomask that are to be transferred to the photoresist layer. The SRAFs are small enough that they are not printed on the photoresist layer. However, the SRAFs are positioned to sharpen the image that is optically transferred from the photomask to the photoresist layer.

Two conventional methods used to determine the placement of SRAFs on a photomask include a rules-based approach and a model-based approach. In a typical rules-based approach to placing SRAFs, edges of the target features of the photomask pattern that require parallel assist features are identified, and SRAFs are placed based on sets of predetermined rules.

FIG. 1A is a top view of a photomask pattern 100 that includes target features 101-111 to be optically transferred to a photoresist layer. Potential locations for SRAFs, shown as dashed rectangles in FIG. 1A, are positioned in parallel with various horizontal and vertical edges of targets features 101-111, in the empty spaces between target features 101-111, in accordance with the predetermined rules. Limitations exist when attempting to extend traditional rules-based assist feature (RBAF) placement algorithms to complex two-dimensional (2D) target feature layouts. As illustrated by FIG. 1A, conflicts exist where the potential SRAF locations (i.e., dashed rectangles) overlap, or are near one another. These conflicts must be resolved. However, such conflict resolution is difficult in the polygon domain using traditional design rule checking (DRC) methods.

FIG. 1B illustrates a possible resolution of the conflicting potential SRAF locations of FIG. 1A, wherein the actual SRAF locations on the photomask pattern 100 are illustrated by polygons having solid borders (and no shading). Note that as designs shrink, the optimal and necessary placements of the SRAFs may no longer be exclusively parallel to the edges of the target features, but may need to follow more complex shapes, which is not possible using a conventional rules-based approach. As described below, a model-based assist feature (MBAF) approach may be used to create more complex shapes, and thereby provide a better result.

FIG. 2 is a top view of a photomask pattern 200 that includes target feature 201 to be optically transferred to a photoresist layer, and associated model-based SRAFs 211-223 that surround the target feature 201. Model-based SRAFs 211-223 are generated by performing iterative process simulations using calibrated process modules, wherein the SRAFs are modified to reduce the differences between the desired optically transferred pattern and the actual optically transferred pattern. Model-based SRAF generation requires a relatively long design time (compared to rules-based SRAF generation), and increases the required photomask complexity and cost (because the SRAFs 211-223 generated by a model-based approach are typically more complex than the SRAFs generated by a rules-based approach, as illustrated by the examples of FIGS. 1B and 2). However, the model-based approach typically provides a better result than the rules-based approach.

It would therefore be desirable to have a method for generating SRAFs that is less complex (and less costly) than a model-based approach, but provides results comparable to a model-based approach. It would further be desirable to have a method for generating SRAFs using a modified rules-based approach, wherein potential SRAF conflicts are easily resolved, the process can be completed relatively quickly, and the resulting SRAF patterns are more complex than those generated by a conventional rules-based approach. It would further be desirable for the resulting SRAF patterns to be composed of simple polygonal shapes that are relatively easy to manufacture.

BRIEF DESCRIPTION OF THE DRAWINGS

FIG. 7B is a graph illustrating the manner in which a dist_scale_factor parameter and the interaction_radius parameter affect the SRAF placement as a target array becomes less dense, in accordance with one embodiment of the present invention.

FIGS. 8A, 8B and 8C are top views of target features and associated SRAF bands, which illustrate the effects of a dist_scale_factor parameter in accordance with one embodiment of the present invention.

FIG. 19 is a top view illustrating a method for adjusting compact triple points of a skeleton structure in accordance with one step of the method of FIG. 14.

FIG. 20 is a top view illustrating a method for adjusting quad-point skeleton structures in accordance with one step of the method of FIG. 14.

FIG. 27 is a top view of polygonal SRAFs, which are placed at locations specified by the straightened seed skeletons of FIG. 26, in accordance with one embodiment of the present invention.

The present invention will be more fully understood in view of the following description.

DETAILED DESCRIPTION

In general, the present invention uses two main strategies to overcome the above-described deficiencies associated with generating sub-resolution assist features using conventional rules-based and model-based approaches. In accordance with a first strategy, rule/placement tables are defined in a 2-dimensional (2D) manner (rather than two 1-dimensional manners, as in conventional rules-based approaches). In accordance with a second strategy, geometries of the assist features are tracked using skeleton networks instead of polygons. This allows for the creation of assist features that can approximate the shapes of assist features generated using a model-based approach, while maintaining the runtime and consistency of rules-based DRC methods. Many complex 2D shape interactions and simplifications are handled more easily using skeletons, rather than polygons, especially when the geometry of the assist features is not strictly rectilinear. The present invention is described in more detail below.

Figure 1A:
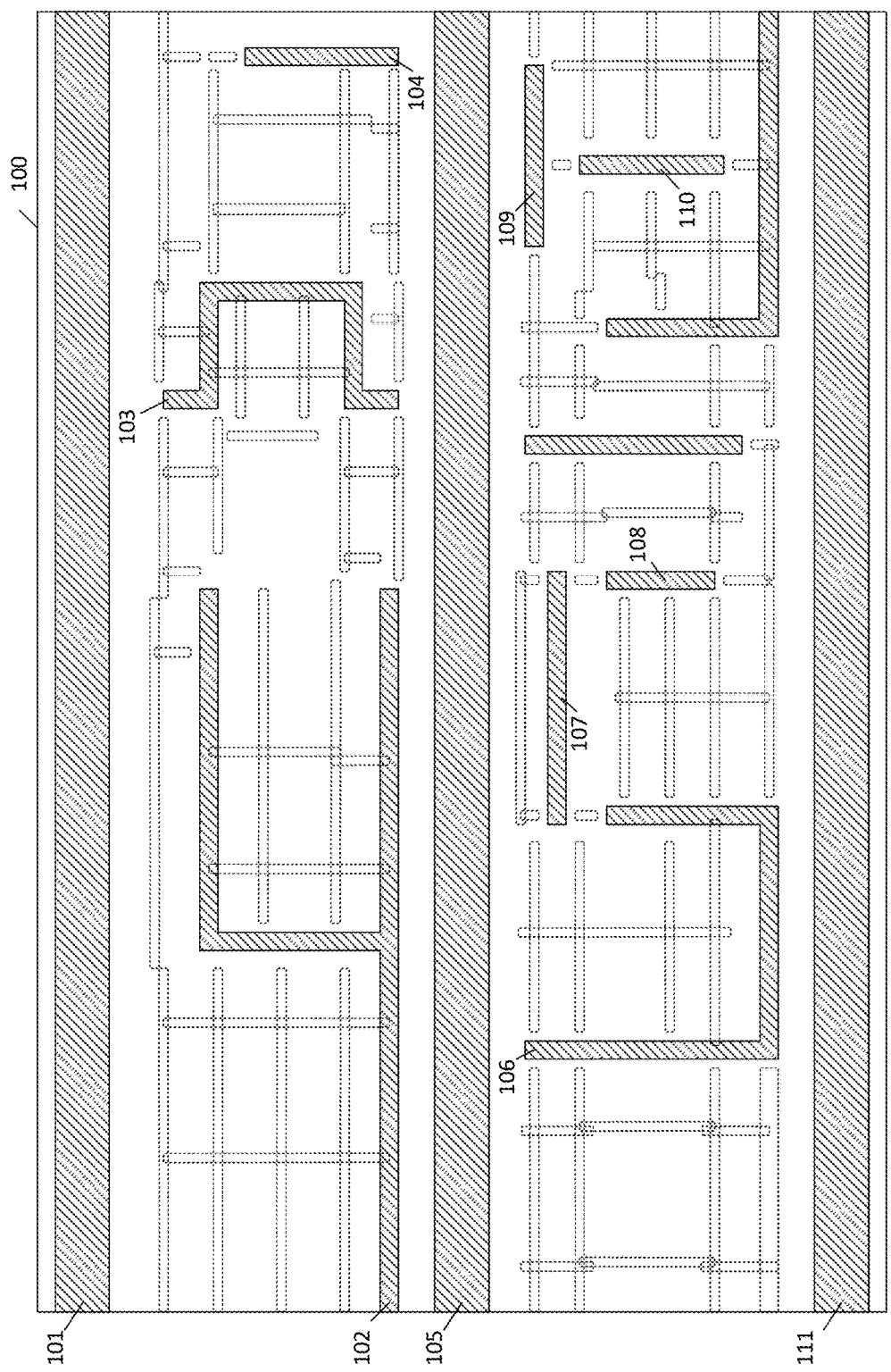
FIG. 1A is a top view of a photomask pattern that illustrates the placement of conflicting rules-based assist features around target features.
Figure 1B:
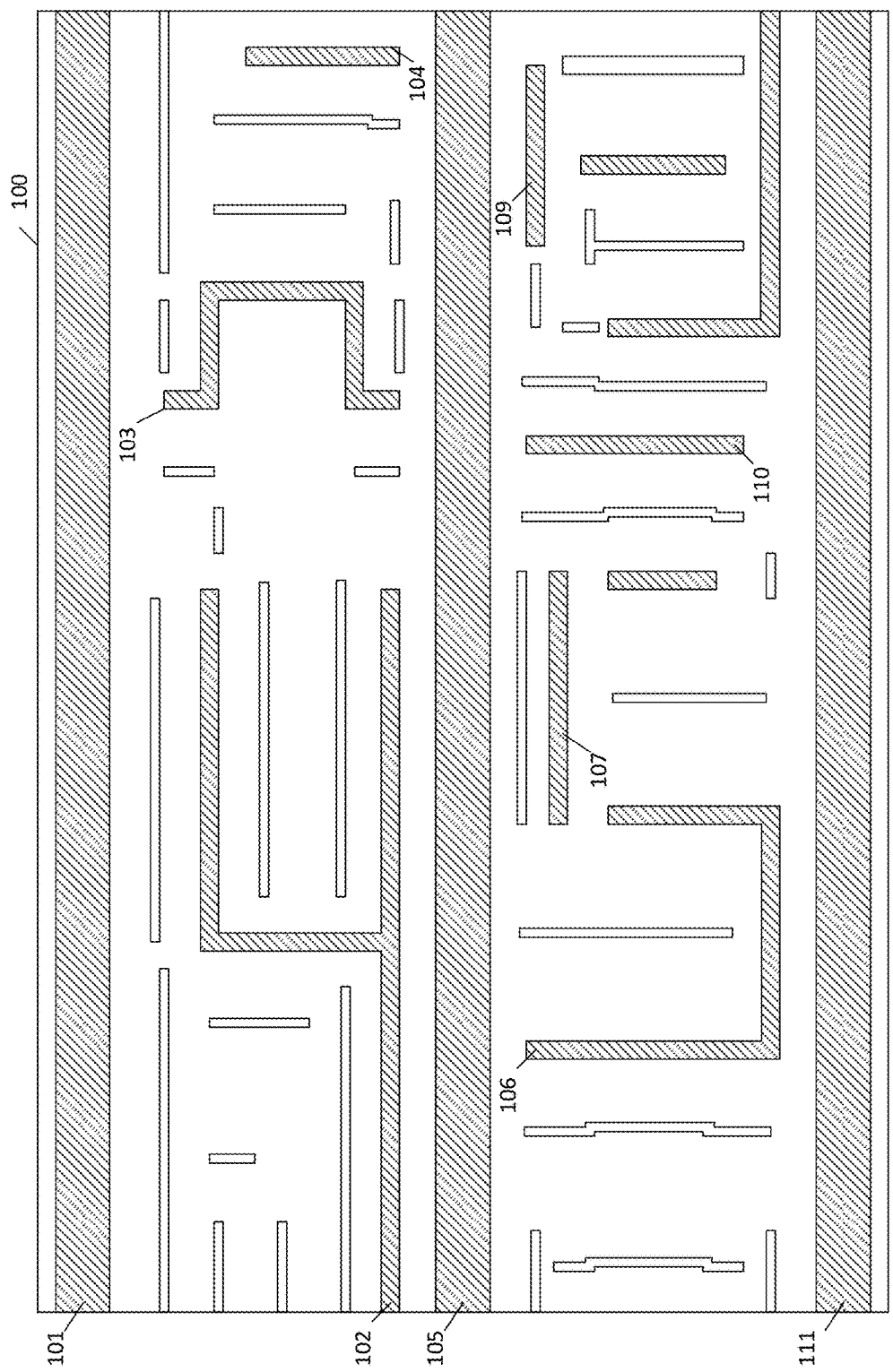
FIG. 1B is a top view of the photomask pattern of FIG. 1A, after the conflicting rules-based assist features have been resolved.
Figure 2:
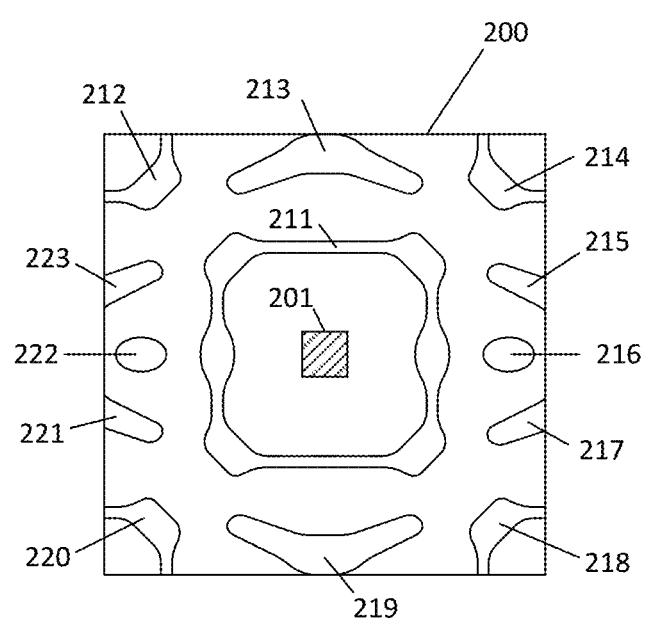
FIG. 2 is a top view of a photomask pattern that illustrates the placement of model-based assist features around a target feature.
Figure 3:
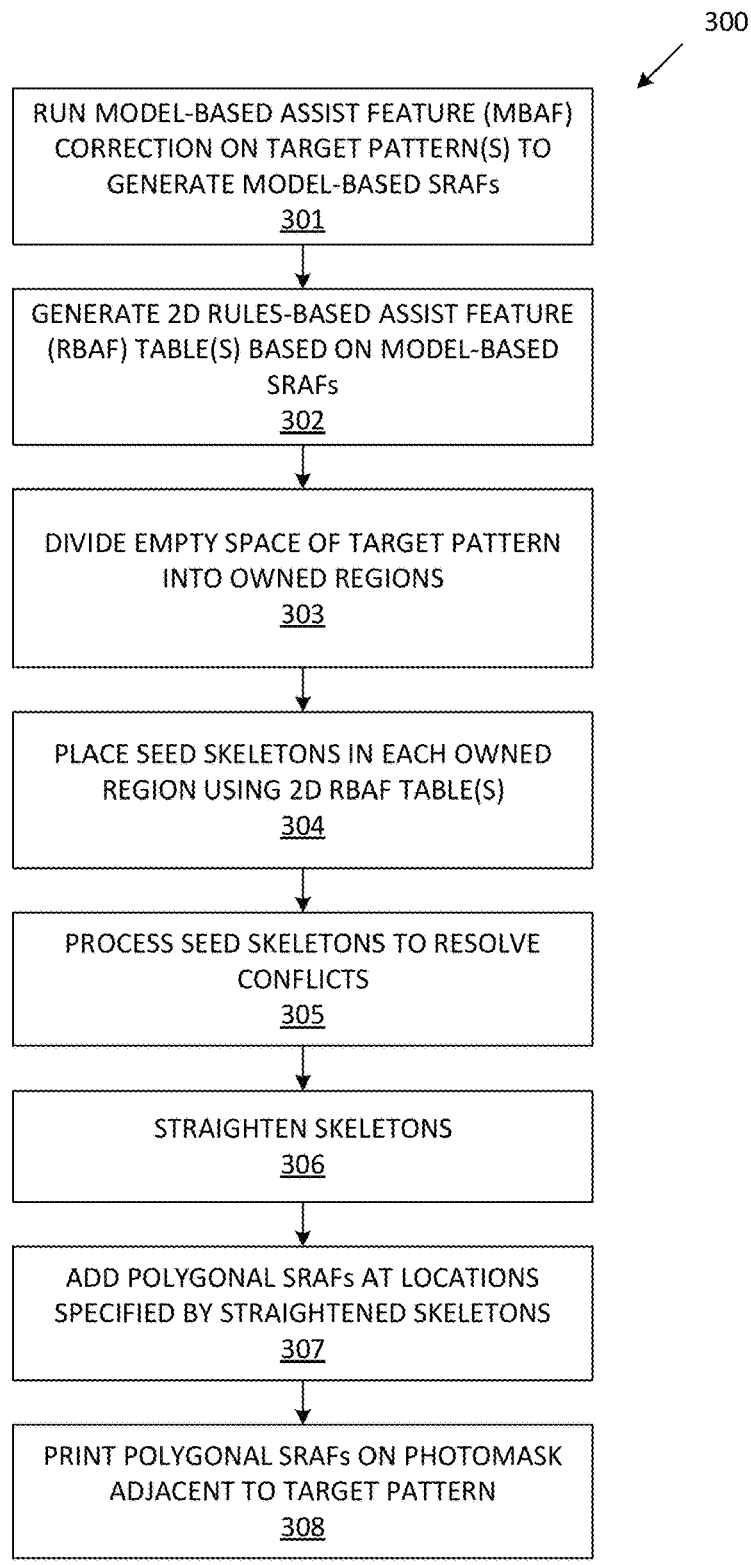
FIG. 3 is a flow diagram illustrating a method for generating sub-resolution assist features (SRAFs) in accordance with the present invention.

FIG. 3 is a flow diagram 300 illustrating a method for generating sub-resolution assist features (SRAFs) in accordance with various embodiments of the present invention. Initially, model-based assist feature (MBAF) correction is performed on one or more target patterns, thereby generating model-based SRAFs (Step 301). These model-based SRAFs are used to generate one or more 2D rules-based assist feature (RBAF) tables (Step 302). As described in more detail, the 2D RBAF table is determined by specifying the distances of the model-based SRAFs from the test pattern at a plurality of different predetermined angles (with the results provided using polar coordinates). The 2D RBAF tables are then used to generate assist features for a target pattern (i.e., a pattern of target features to be included on a photomask). To accomplish this, the empty space of the target pattern is divided into a plurality of owned regions using a medial axis transform (MAT) operation, wherein each of the target features is located in a corresponding owned region (Step 303). The 2D RBAF tables are then used to place a seed skeleton in each of the owned regions, wherein each of the seed skeletons includes one or more lines/curves (Step 304). The seed skeletons are then processed to remove any conflicts, including conflicts that may exist at boundaries of the various owned regions (Step 305). The processed skeletons are then straightened, such that the straightened skeletons includes lines that extend along X and Y axes of the photomask, as well as lines that extend at 45 degree angles with respect to the X and Y axes of the photomask (Step 306). Polygonal (e.g., rectangular) SRAFs are then placed along the locations specified by the straightened skeletons, wherein the polygonal SRAFs have widths similar to the widths of the associated model-based SRAFs (Step 307). These polygonal SRAFs are printed adjacent to the target pattern on a photomask (Step 308). The various steps of method 300 will now be described in more detail, using one or more examples.

Figure 4:
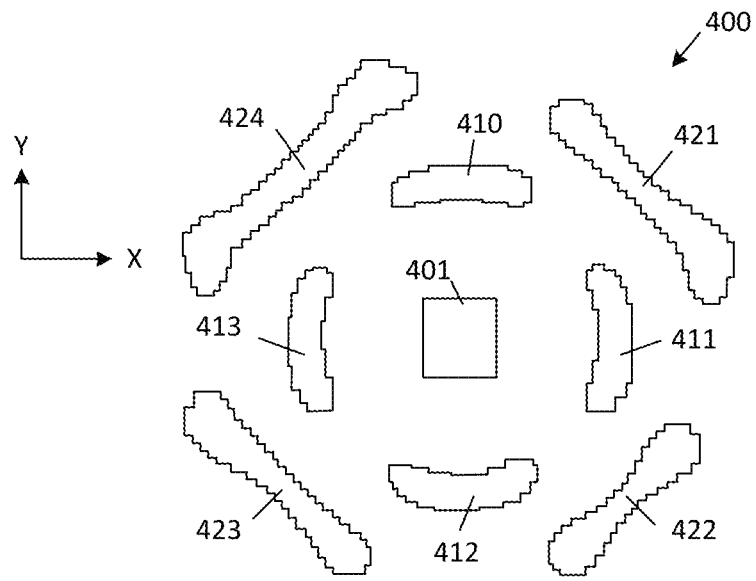
FIG. 4 is a top view of a photomask pattern, which includes a target feature and SRAFs generated using a model-based assist feature correction method in accordance with the method of FIG. 3.

FIG. 4 is a top view of a photomask 400, which includes target feature 401 and SRAFs 410-413 and 421-424, which are generated using a model-based assist feature correction method in accordance with Step 301. Note that the model-based SRAFs 410-413 and 421-424 are not symmetric. In particular, model-based SRAF 424 has a different shape than model-based SRAFs 421-423. The irregular shapes of the model-based SRAFs are typically due to noise that exists in the model-based system.

Figure 5:
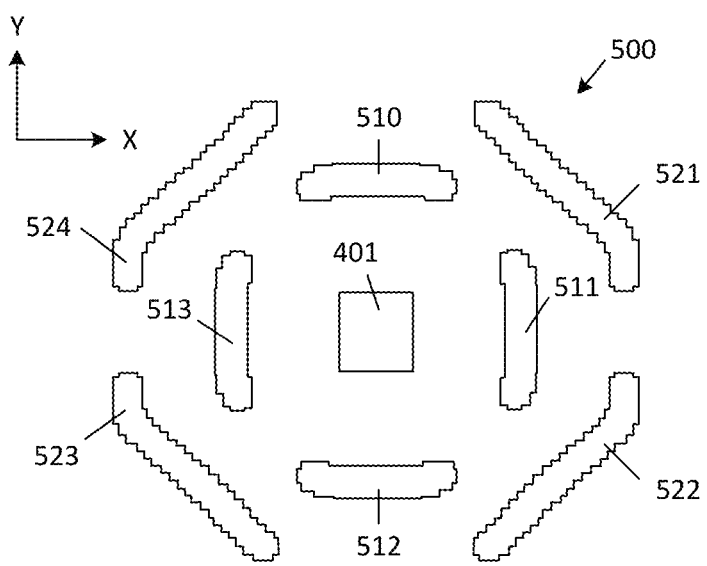
FIG. 5 is a top view of a photomask pattern, which includes a target feature and SRAFs derived from the photomask pattern of FIG. 4 in accordance with one embodiment of the present invention.

FIG. 5 is a top view of a photomask 500, which includes target pattern 401, along with 2D rule-based SRAFs 510-513 and 521-524. In accordance with one embodiment, SRAFs 510-513 and 521-524 are generated in an iterative manner based on the model-based SRAFs 410-413 and 421-424. More specifically, the average characteristics of the model-based SRAFs 410-413 and 421-424 (e.g., average distances of the SRAFs 410-413 and 421-424 from the target feature 401, relative angles of the SRAFs 410-413 and 421-424 with respect to the target feature 401, and the widths of the SRAFs 410-413 and 421-424) are examined to determine whether one or more rules can be used to specify a 'cleaner' version of the model-based SRAFs 410-413 and 421-424. In this 'cleaner' version, the SRAFs are symmetrical about the target feature 401, have constant widths, and include relatively straight segments located along the X-axis, the Y-axis, and at 45 degrees with respect to the X and Y axes. In the present example, a set of rules can be used to specify the SRAFs 510-513 and 521-524 of FIG. 5 (which represent a 'cleaner' version of the model-based SRAFs 410-413 and 421-424 of FIG. 4). The photomask 500 (including the SRAFs 510-513 and 521-524) is simulated, and the quality of this mask is determined using software simulation. That is, the software simulation determines whether the target feature 401 would be accurately transferred to a photoresist layer using the simulated photomask 500. The set of rules used to specify the SRAFs 510-513 and 521-524 can be modified (e.g., in an iterative manner) until the results achieved by the SRAFs 510-513 and 521-524 approximate the results achieved by the model-based SRAFs 410-413 and 421-424. When this result is achieved, the final set of rules is saved as a 2D RBAF rules table (Step 302).

In the present example, the 2D RBAF rules table is associated with the target feature 401, which is a rectangle. It is understood that the 2D RBAF rules table associated with target feature 401 can also be applied to other target features. However, it is understood that some other target features having different shapes and/or different proximities to neighboring target features may require different 2D RBAF tables (i.e., if the 2D RBAF table associated with target feature 401 does not provide acceptable SRAFs for these other target features). In this case, additional 2D RBAF tables can be derived for these other target features using the same method described above. It is expected that no more than 10 to 20 2D RBAF rules tables will be required to define all of the SRAFs associated with a photomask.

Figure 6A:
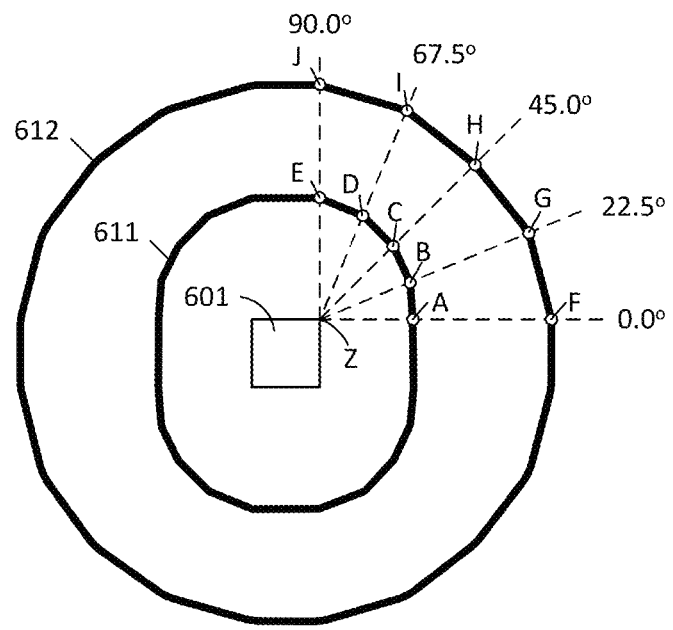
FIG. 6A is a top view of seed skeletons specified by polar coordinates of a two-dimensional (2D) rules-based assist feature (RBAF) rules table in accordance with one embodiment of the present invention.

The manner in which the 2D RBAF rules table specifies the SRAFs in accordance with one embodiment of the present invention will now be described. FIG. 6A illustrates a target feature 601 and two corresponding seed skeletons 611-612, which are used to define SRAFs in a manner described in more detail below. The corresponding 2D RBAF table that defines the seed skeletons 611-612 uses polar coordinates associated with one quadrant around the target feature 601, as well as a parameter that indicates that the polar coordinates are repeated in each quadrant around the target feature 601. The magnitude of each of the polar coordinates is defined by a "seed_distance" parameter, and the angle of each of the polar coordinates is defined by a "thetas" parameter. An "enforce_symmetry" parameter indicates whether the seed_distance and thetas parameters are mirrored into other quadrants (enforce_symmetry=True) or not (enforce_symmetry=False). In the embodiments described herein, the list of thetas parameters starts with 0.0, includes angles within the range of 0.0°, 360.0°, and has an ascending order. The default value of thetas=[0.0], which implies the same seed_distance value is applied in all 360 degrees.

Thus, for the example of FIG. 6A, the 2D RBAF table that defines the seed skeletons 611-612 may include the following parameters:
  seed_distance=[[64.0, 69.0, 73.0, 79.0, 86.0], [165.0, 161.0, 156.0, 160.0, 166.0]]
  thetas=[0.0, 22.5, 45.0, 67.5, 90.0],
  enforce_symmetry=True
Thus, the points A, B, C, D and E on the seed skeleton 611 are located at distances 64.0 nm, 69.0 nm, 73.0 nm, 79.0 nm and 86.0 nm, respectively, from the corresponding corner Z of target feature 610. Moreover, the points A, B, C, D and E on assist feature 611 are located at 'thetas' angles 0.0°, 22.5°, 45°, 67.5°, 90.0° respectively, as illustrated.

Similarly, the points F, G, H, I and J on seed skeleton 612 are located at distances 165.0 nm, 161.0 nm, 156.0 nm, 160.0 nm and 166.0 nm, respectively, from the corresponding corner Z of target feature 610. Moreover, the points F, G, H, I and J on assist feature 612 are located at 'thetas' angles 0.0°, 22.5°, 45°, 67.5° and 90.0°, respectively, as illustrated. Because the enforce_symmetry parameter of the 2D RBAF table is 'True', the seed_distance and thetas are mirrored to each of the corners of the target feature 601, to create the seed skeletons 611 and 612.

Figure 6B:
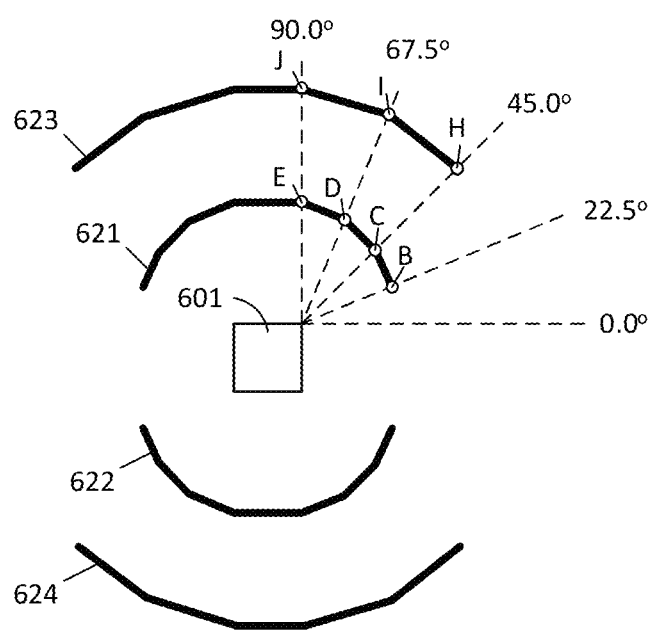
FIG. 6B is a top view of seed skeletons specified by polar coordinates of a 2D RBAF rules table in accordance with an alternate embodiment of the present invention.

FIG. 6B illustrates the target feature 601 and four corresponding seed skeletons 621-624, which are associated with a different illumination source than the seed skeletons 611-612 of FIG. 6A. In the example of FIG. 6B, not all of the thetas angles include corresponding seed_distance values. These thetas angles will have no corresponding seed_distance (i.e., "None") in the corresponding 2D RBAF table. Thus, for the example of FIG. 6B, the 2D RBAF table may include the following parameters:

seed_distance=[[None, 69.0, 73.0, 79.0, 86.0], [None, None, 161.0, 156.0, 160.0, 166.0]]
thetas=[0.0, 22.5, 45, 67.5, 90.0],
enforce_symmetry=True In effect, the 2D RBAF table of FIG. 6B eliminates the points A, F and G from the example of FIG. 6A. These eliminated points result in the formation of separate seed skeletons 621-624 when mirrored to each of the corners of the target feature 601. Thus, in the example of FIG. 6B, the associated illumination configuration does not require assist features to the immediate left and right of the target feature 601.

Although the examples provided above in FIGS. 6A-6B include two bands of seed skeletons (and therefore two bands of associated SRAFs), it is understood that more (or fewer) bands of seed skeletons (SRAFs) can be implemented by including other numbers of "seed_distance" lists. Also, while the examples provided in FIGS. 6A-6B include five different "thetas" angles, it is understood that other numbers of "thetas" angles can be used in other embodiments. For example, the 2D RBAF table for the SRAFs 510-512 and 521-524 of FIG. 5 may be specified as follows:
    seed_distance=[[95.5, 95.0, 94.5, 93.9, 92.7, 90.9, None, None, None, None, None, None, None, 95.6, 96.7, 96.8, 96.5, 96.3, 96.2],
    [None, None, 176.2, 179.9, 181.2, 175.0, 167.1, 161.5, 158.8, 157.9, 158.4, 161.0, 165.8, 168.2, None, None, None, None, None]]
    thetas=[0.0, 5.0, 10.0, 15.0, 20.0, 25.0, 30.0, 35.0, 40.0, 45.0, 50.0, 55.0, 60.0, 65.0, 70.0, 75.0, 80.0, 85.0, 90.0]
    enforce_symmetry=True As described above, the 2D RBAF table specifies a plurality of points that are joined by lines to form seed skeletons. As described in more detail below, these seed skeletons are laid out for each of a plurality of target features, processed to resolve conflicts and provide simplifications, and then straightened. Polygonal assist features are then laid out along the paths defined by the straightened processed skeletons.

Figure 6C:
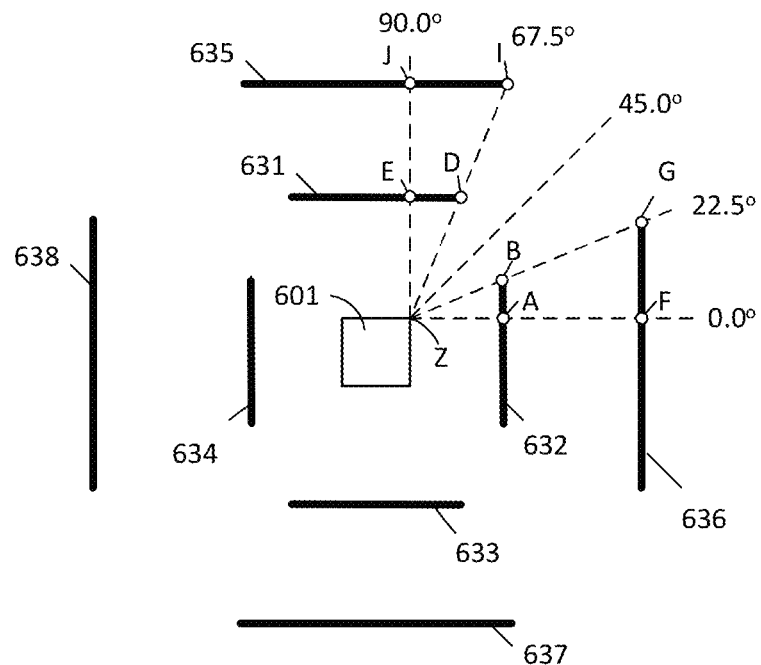
FIG. 6C is a top view of seed skeletons specified by polar coordinates of a 2D RBAF rules table, wherein the seed skeletons define rectangular SRAFs, in accordance with an alternate embodiment of the present invention.
Figure 6D:
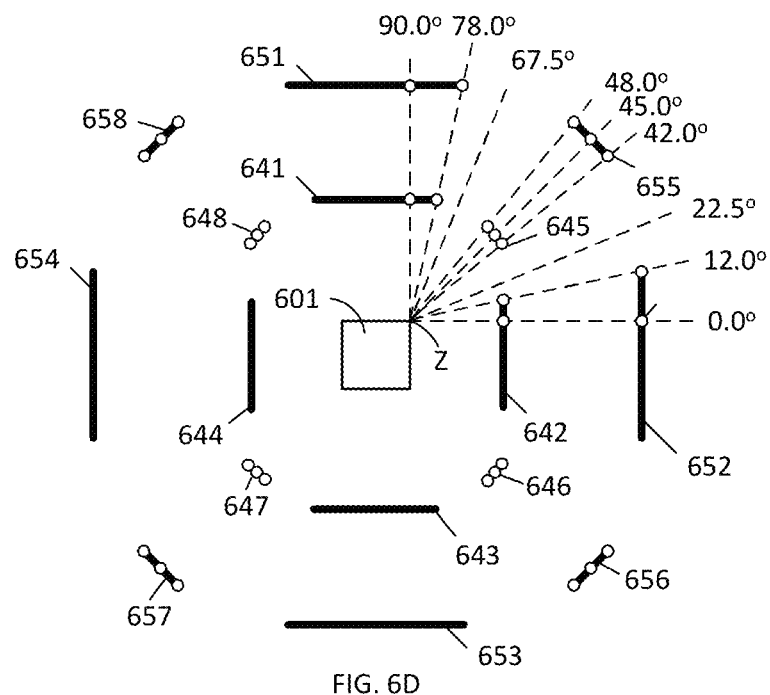
FIG. 6D is a top view of seed skeletons specified by polar coordinates of a 2D RBAF rules table, wherein the seed skeletons define both rectangular and square SRAFs, in accordance with an alternate embodiment of the present invention.

In accordance with one embodiment, the 2D RBAF table can be used to control the shape of the seed skeletons. In the example of FIGS. 6A and 6B, the seed skeletons have a 'rounded' shape. However, it is understood that by adjusting the seed_distance, the seed skeletons can be modified to have only straight lines, such that the resulting SRAFs will consist of only rectangles, as illustrated by the seed skeletons 631-638 of FIG. 6C, or rectangles and squares, as illustrated by the seed skeletons 641-648 and 651-658 of FIG. 6D. Note that the seed skeletons 645-648 and 655-658 are eventually turned into square SRAFs during subsequent processing (described in more detail below).

Figure 7A:
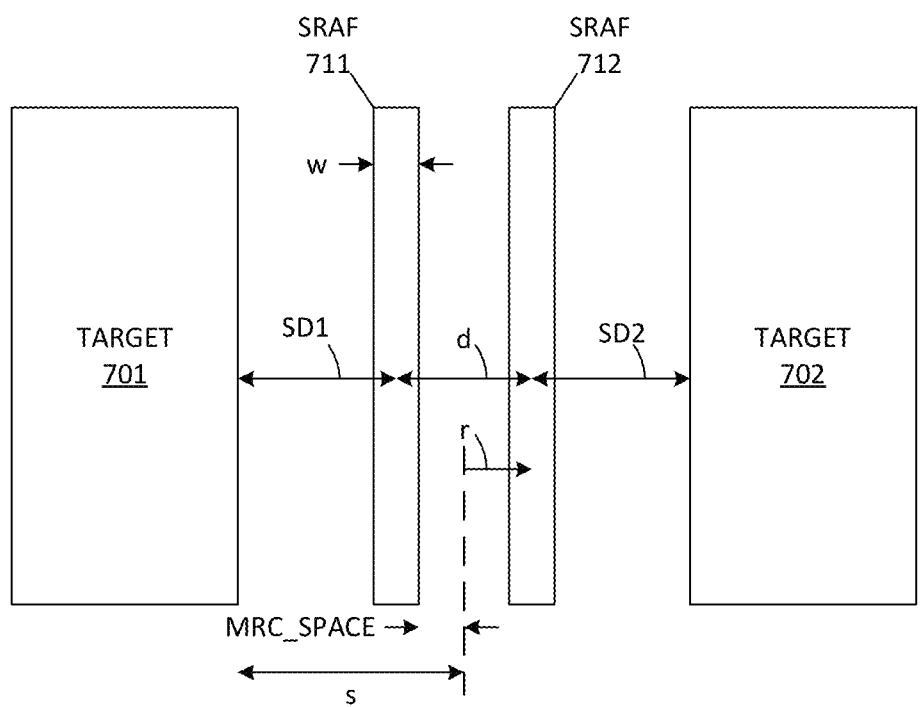
FIG. 7A is a top view of target features and associated polygonal SRAFs, which illustrate an interaction_radius parameter in accordance with one embodiment of the present invention.

In accordance with one embodiment, the 2D RBAF rules table also includes an "interaction_radius" parameter that sets the minimum assist feature seeding distance between the centers of two SRAFs by band. FIG. 7A is a top view of two adjacent target features 701-702, wherein the 2D RBAF rules table defines a seed_distance SD1 from the right edge of target feature 701, and a seed_distance SD2 from the left edge of target feature 702. The seed_distance SD1 and SD2 correspond with the same SRAF band of target features 701 and 702 (e.g., the first SRAF band). The polygonal SRAFs 711 and 712 generated at the corresponding seed_distance SD1 and SD2 each have a width "w", which is also defined by the 2D RBAF rules table. A center-to-center distance (d) exists between the seed_distance SD1 and SD2. The interaction_radius "r" is equal to half of this center-to-center distance (d). If the actual interaction radius "r" is less than the "interaction_radius" value specified for the associated SRAF band (as set in the 2D RBAF rules table), then the SRAFs 711-712 are merged into a single SRAF. The interaction_radius parameter is greater than zero. In one embodiment, the interaction_radius parameter is set to a value equal to or greater than 0.5*(MRC_space+w), wherein MRC_space is defined as half of a minimum distance allowed between the edges of adjacent SRAFs. The MRC_space is illustrated in FIG. 7A, and is typically selected to have about the same size as the width w. In the above-described manner, the interaction_radius parameter is used to control the interaction between neighboring seeding regions.

In accordance with another embodiment, the 2D RBAF rules table may optionally include a "dist_scale_factor" parameter for each of the SRAF bands (allowing each SRAF band to be controlled independently). The dist_scale_factor parameter varies between a range of 0.0 to 1.0, and is applied to the seed_distance parameters of the corresponding AF band to scale the seed_distance parameters to allow for early insertion of the SRAFs. A smaller dist_scale_factor value allows more AFs to be inserted into a tighter space. That is, a smaller dist_scale_factor value reduces the minimum space required to insert SRAFs between two target features.

FIG. 7B is a graph illustrating the manner in which the dist_scale_factor parameter and the interaction_radius parameter affect the SRAF placement as a target array becomes less dense. The combination of usage of the dist_scale_factor parameter and the interaction_radius parameter allows for a flexible transition from 0 to 1 to 2 SRAFs between the target features, as shown in FIG. 7B.

In FIG. 7B, the x-axis represents the value "s", which is defined as the ½ space width between the edges of two adjacent target features. This "s" parameter is visually illustrated for target features 701-702 in FIG. 7A. The y-axis represents the distance from the edge of the target feature to the SRAF (e.g., SD1 for target feature 701 or SD2 for target feature 702 in FIG. 7A).

The solid curve 721 in FIG. 7B corresponds with a dist_scale_factor value of 1.0 (i.e., there is no distance scaling applied to the seed_distance parameter to allow for early insertion of SRAFs) and an interaction_radius value greater than 0. When the s value is less than the seed_distance parameter of the corresponding target feature (e.g., s<SD1 for target feature 701 and s<SD2 for target feature 702), no SRAFs are introduced between the target features 701 and 702, because the target features are too close together. Under these conditions, which are represented by s values less than $S_1$ in FIG. 7B, Pattern A represents the general layout of target features and assist features (wherein there are no assist features present between the target features, which are illustrated as an array of squares).

When the s value is greater than $S_1$ on the solid curve 721, one or more SRAFs may be located between the target features. When the s value is greater than $S_1$ (e.g., the seed_distance SD1), but less than the seed_distance (e.g., SD1) plus the interaction_radius (e.g., r), then one SRAF (of the first SRAF band) may be located between the target features. Pattern C and Pattern D represent the general layout of target features and assist features when one SRAF of the first SRAF band is located between the target features. Note that the value of s is greater in Pattern D than in Pattern C, such that the target features are located farther apart in Pattern D.

When the s value is greater than $S_2$ (e.g., the seed_distance SD1 plus the interaction_radius), then two SRAFs (of the first SRAF band) may be located between the target features. Pattern E represents the general layout of target features and assist features when two SRAFs (e.g., SRAFs 711 and 712) of the first band of SRAFs are located between adjacent target features.

The dashed curve 722 of FIG. 7B corresponds with a dist_scale_factor parameter having a value of less than 1.0 (i.e., distance scaling is applied to the seed_distance parameter to allow for early insertion of SRAFs) and an interaction_radius value greater than 0. In FIG. 7B, the s value $S_0$ represents the smallest half spacing value where SRAFs will be inserted. When the s value is less than the seed_distance parameter of the corresponding target feature multiplied by the dist_scale_factor (e.g., s<SD1*dist_scale_factor for target feature 701 and s<SD2*dist_scale_factor for target feature 702), no SRAFs are introduced between the target features 701 and 702, because the target features are too close together. Under these conditions, which are represented by s values less than $S_0$ in FIG. 7B, Pattern A represents the general layout of target features and assist features.

If the s value is greater than $S_0$ on the dashed curve 722, one or more SRAFs may be located between the target features. When the s value is greater than $S_0$ (e.g., the seed_distance SD1*dist_scale_factor), but less than $S_0$ plus the interaction_radius (e.g., r), then one SRAF (of the first SRAF band) may be located between the target features. Pattern B represents the general layout of target features and assist features when the s value is equal to $S_0$. Note that in Pattern B, the assist features are located in a smaller space between the target features than in Patterns C and D. As the s value increases, the dashed curve 722 proceeds along the path that includes Pattern C and Pattern D (described above).

When the s value is greater than $S_2$ (e.g., the seed_distance SD1 plus the interaction_radius), then two SRAFs (of the first SRAF band) may be located between the target features. Again, Pattern E represent the general layout of target features and assist features under these conditions.

FIGS. 8A, 8B and 8C are top views illustrating two SRAF bands surrounding five target features A, B, C, D and E. The first SRAF bands of FIGS. 8A, 8B and 8C are labeled as SRAF bands 811, 812 and 813, respectively. The second SRAF bands of FIGS. 8A, 8B and 8C are labeled as SRAF bands 821, 822 and 823, respectively. The dist_scale_factor of the second SRAF bands of FIGS. 8A, 8B and 8C are all equal to 1.0, such that the corresponding SRAF bands 821, 822 and 823 are identical. However, the dist_scale_factor of the first SRAF bands of FIGS. 8A, 8B and 8C are equal to 1.0, 0.9 and 0.7, respectively. As a result, more SRAF coverage is provided by the SRAF band 812 (FIG. 8B) than the SRAF band 811 (FIG. 8A), and more SRAF coverage is provided by the SRAF band 813 (FIG. 8C) than the SRAF band 812 (FIG. 8B). The increased SRAF coverage introduced by the smaller dist_scale_factor values can be seen by comparing the portions of the SRAF bands 811, 812 and 813 included within the identical dashed regions of FIGS. 8A, 8B and 8C.

In accordance with another embodiment, the 2D RBAF rules table may optionally include a rectangular_strength parameter for each of the SRAF bands (allowing each SRAF band to be controlled independently). The rectangular_strength parameter varies between a range of 0.0 to 1.0, and is applied to the seed_distance parameters internally at corner areas (non-0 or 90 degree angles) to increase the rectangular behavior of the seed_distance parameters. A rectangular_strength value of 0.0 indicates no change to the seed_distance values of the associated SRAF band, and a rectangular_strength value of 1.0 indicates a full rectangularization of the seed_distance values of the associated SRAF band. Making the SRAF bands more rectangular can be advantageous because photomasks can easily print straight lines (e.g., rectangles and triangles), wherein curved lines must be broken down into a many smaller blocks. It is therefore less expensive to fabricate photomasks that implement rectangular SRAFs.

Figure 9B:
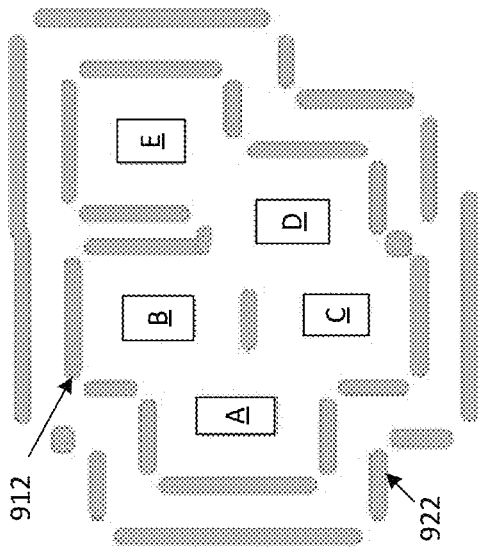
FIGS. 9A and 9B are top views of target features and associated SRAF bands, which illustrate the effects of a rectangular_strength parameter in accordance with one embodiment of the present invention.
Figure 9A:
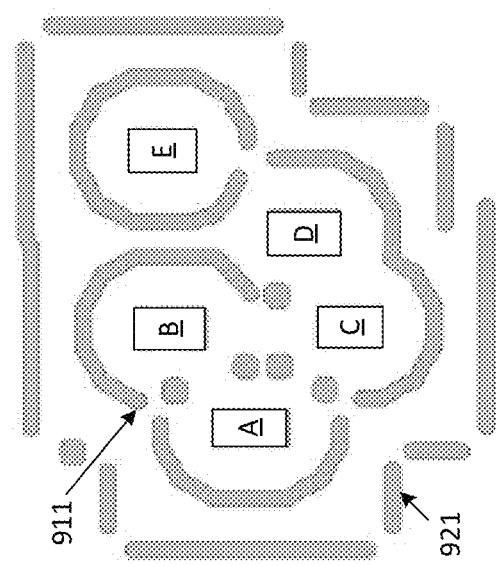

FIGS. 9A and 9B are top views illustrating rectangularizations of the SRAF bands 812 and 822 of FIG. 8B. In the example of FIG. 9A, the rectangular_strength values of the SRAF bands 812 and 822 are selected to be 0.0 and 1.0, respectively. As a result, the first SRAF band 911 of FIG. 9A is unchanged from the SRAF band 812 of FIG. 8B, and the second SRAF band 921 of FIG. 9A is a fully rectangularized version of the second SRAF band 822 of FIG. 8B.

In the example of FIG. 9B, the rectangular_strength values of the SRAF bands 812 and 822 are selected to be 1.0 and 1.0, respectively. As a result, both the first SRAF band 912 and the second SRAF band 922 of FIG. 9A are fully rectangularized versions of the first SRAF band 812 and the second SRAF band 822, respectively of FIG. 8B. Rectangular_strength values between 0.0 and 1.0 will result in varying degrees of rectangularization of the SRAF bands.

After the 2D RBAF rules table has been generated in the manner described above, the empty space of the target pattern is divided into owned regions using a medial axis transform function (MAT) (FIG. 3, Step 303). The medial axis transform function divides the empty space into "owned" regions that are exclusively associated with the corresponding target features. The boundaries of each owned region are equidistant from two or more points on the edges of the target features. Although the MAT function is known in computational geometry, this function has not previously been used to facilitate the placement of SRAFs. As described in more detail below, SRAFs associated with a target feature are not allowed to encroach into owned regions associated with other target features, greatly simplifying the placement of the SRAFs by eliminating the crossing of SRAFs across the boundaries of the owned regions.

Figure 10:
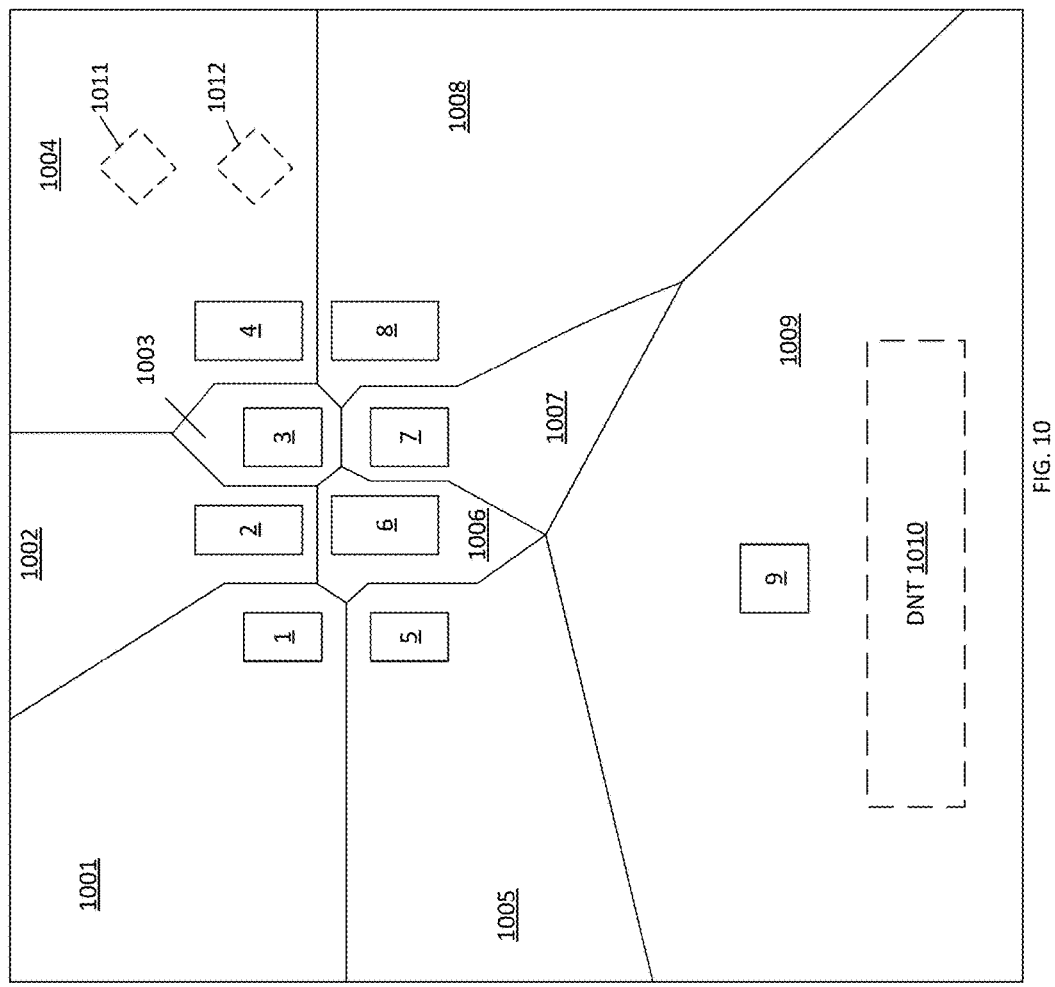
FIG. 10 is a top view of target features and associated owned regions formed by a medial axis transform function in accordance with one embodiment of the present invention.

FIG. 10 is a top view of target pattern that includes target features 1-9, wherein a MAT function divides the target pattern into a plurality of owned regions 1001-1009 (Step 303). Note that the MAT function results in each of the target features 1-9 being located in a corresponding one of the owned regions 1001-1009. In an alternate embodiment, custom owned regions may be specified for the target features using a special code, which may or may not use the medial axis transform. Custom owned regions may be used to perturb/erase the medial axis in a specific region, so that one target feature is "greedier" locally, resulting in a larger corresponding custom owned region. Again, each of the target features has exactly one corresponding custom owned region.

In the illustrated example, there are three different groups of target features, wherein the first group G1 includes target features 1-4, the second group G2 includes target features 5-8, and the third group G3 includes target feature 9. Each of the groups G1, G2 and G3 includes its own corresponding 2D RBAF rules table. In this manner, different groups of target features (or each of the target features) can have different 2D RBAF rules tables. A plurality of "do not touch" (DNT) regions 1010, 1011 and 1012 are also defined in the example of FIG. 10. In the described example, DNT regions 1010-1012 are regions where no SRAFs are to be placed. In an alternate embodiment, DNT regions 1010-1012 defines regions, wherein SRAFs placed within these regions 1010-1012 in accordance with the associated 2D RBAF rules table are not modified by further processing.

Figure 11:
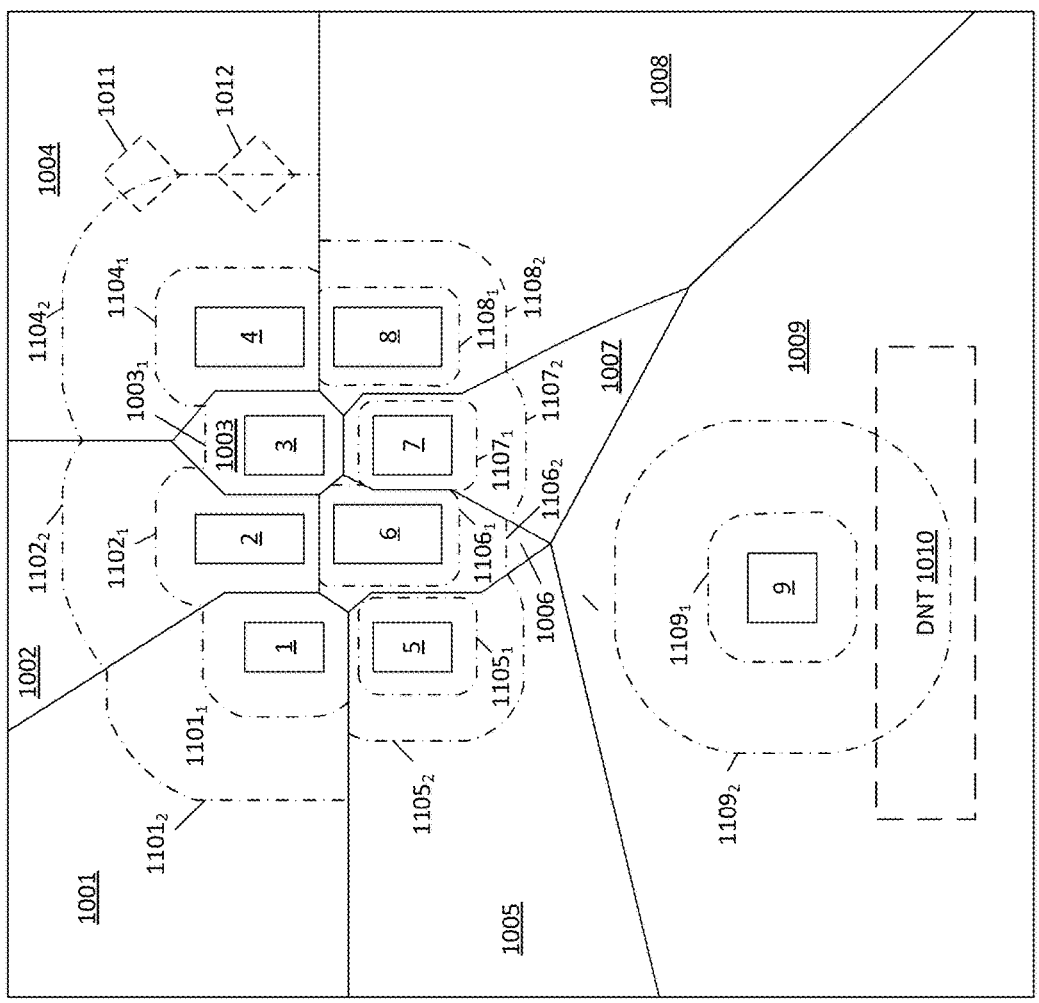
FIG. 11 is a top view of the target features and associated owned regions of FIG. 10, with seed skeletons added from 2D RBAF rules tables, in accordance with one embodiment of the present invention.

As illustrated by FIG. 11, seed skeletons are placed in each of the owned regions 1001-1009 using the 2D RBAF rules tables assigned to the corresponding target features 1-9 (Step 304). Thus, seed skeletons $1101_1$ and $1101_2$ are placed in owned region 1001 using the 2D RBAF rules table assigned to corresponding target feature 1. Note that although the 2D RBAF rules table associated with target feature 1 defines two bands of seed skeletons that completely encircle target feature 1, the seed skeletons $1101_1$ and $1101_2$ are only placed in the owned region 1101 associated with the target feature 1.

In a similar manner, seed skeletons $1102_1$-$1102_2$, $1103_1$, $1104_1$-$1104_2$, $1105_1$-$1105_2$, $1106_1$-$1106_2$, $1107_1$-$1107_2$, $1108_1$-$1108_2$ and $1109_1$-$1109_2$ are placed in owned regions 1102-1109, respectively, using the 2D RBAF rules tables assigned to target features 2-9, respectively. In general, the subscripts '1' and '2' used to label the seed skeletons refer to a first (inner) SRAF band and a second (outer) SRAF band, respectively. Because the same 2D RBAF rules table is assigned to target features 1-4 (group G1), the associated seed skeletons are aligned at the borders of owned regions 1001, 1002, 1003 and 1004. Similarly, because the same 2D RBAF rules table is assigned to target features 5-8 (group G2), the associated seed skeletons are aligned at the borders of owned regions 1005, 1006, 1007 and 1008. Placing the seed skeletons within the owned regions 1001-1009 in the manner described above advantageously simplifies the seed skeleton placement, and eliminates placement conflicts within the owned regions.

In the example of FIG. 11, the seed_distance parameters of the 2D RBAF rules table associated with the target features 1-4 of group G1 are larger than the seed_distance parameters of the 2D RBAF rules table associated with the target features 5-8 of group G2. Although the seed_distance parameters of groups G1 and G2 are different in the illustrated example, it is understood that the seed_distance parameters of groups G1 and G2 can be the same in other embodiments.

The seed skeletons $1101_1$-$1101_2$, $1102_1$-$1102_2$, $1103_1$, $1104_1$-$1104_2$, $1105_1$-$1105_2$, $1106_1$-$1106_2$, $1107_1$-$1107_2$, $1108_1$-$1108_2$ and $1109_1$-$1109_2$ are then processed to resolve any conflicts that may be imposed by the 2D RBAF rules tables (FIG. 3; Step 305). More specifically, the seed skeletons are biased up (thickened) by widths corresponding with the interaction_radius parameters of the associated 2D RBAF rules tables.

Figure 12:
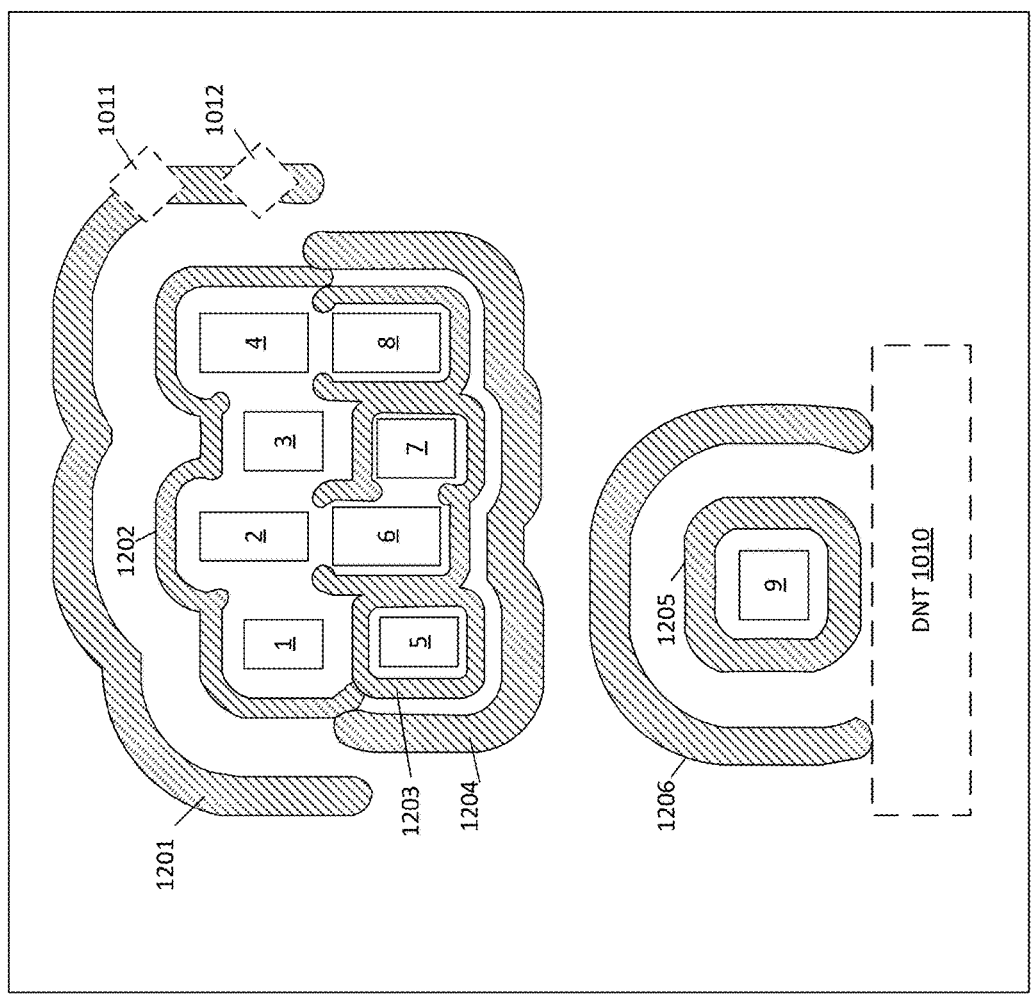
FIG. 12 is a top view of the seed skeletons of FIG. 11, after these seed skeletons have been widened in response to an interaction_radius parameter in accordance with one embodiment of the present invention.

FIG. 12 is a top view illustrating thickened skeletons 1201-1206 that result from biasing up the seed skeletons $1101_1$-$1101_2$, $1102_1$-$1102_2$, $1103_1$, $1104_1$-$1104_2$, $1105_1$-$1105_2$, $1106_1$-$1106_2$, $1107_1$-$1107_2$, $1108_1$-$1108_2$ and $1109_1$-$1109_2$ in accordance with the present example. Note that the thickened skeletons 1201-1206 are excluded from the DNT regions 1010-1012. In an alternate embodiment, the seed skeletons can be eliminated from the DNT regions 1010-1012 before thickening these seed skeletons.

Figure 13:
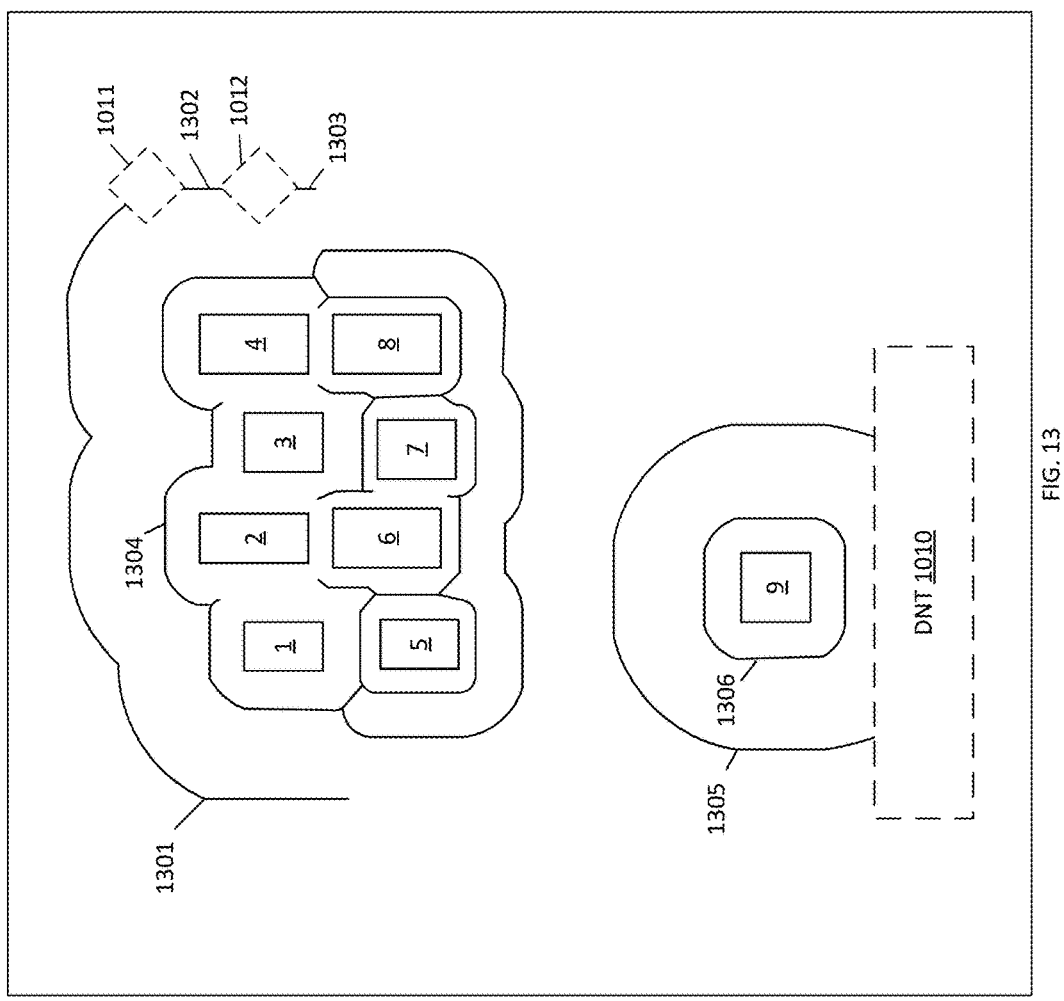
FIG. 13 is a top view of seed skeletons of FIG. 12, after these seed skeletons have been re-skeletonized in accordance with one embodiment of the present invention.

As illustrated by FIG. 13, the thickened skeletons 1201-1206 are re-skeletonized, wherein continuous features of the thickened skeletons 1201-1206 are merged, thereby resolving any conflicts introduced by the 2D RBAF rules tables inducing skeletons too near to each other. The results of the re-skeletonization are shown by skeleton structures 1301-1306 of FIG. 13.

Figure 14:
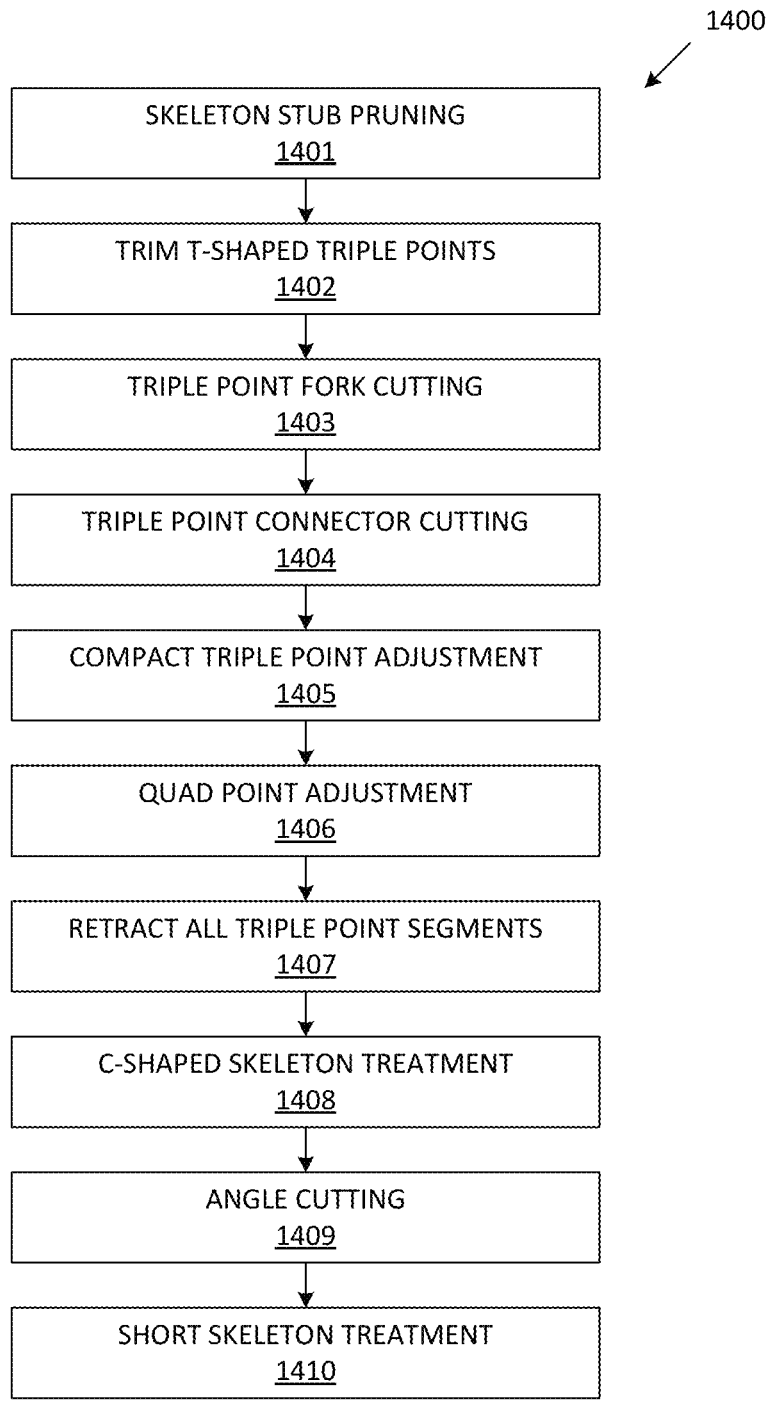
FIG. 14 is a flow diagram of a method used to clean the re-skeletonized seed skeletons of FIG. 13 in accordance with one embodiment of the present invention.

In one embodiment, the skeleton structures 1301-1306 may represent the conclusion of the conflict resolution process of Step 305. However, in accordance with another embodiment, the skeleton structures 1301-1306 are subject to one or more cleaning steps for further optimization. FIG. 14 is a flow diagram illustrating a ten step skeleton cleaning process 1400 in accordance with one embodiment of the present invention. FIGS. 15-24 are top views of skeleton structures that illustrate the ten steps 1401-1410 of the cleaning process 1400 in accordance with various embodiments of the present invention. It is understood that any number of the ten steps 1401-1410 of process 1400 can be implemented in accordance with various embodiments of the present invention. The steps of cleaning process 1400 are described in more detail below.

Figure 15:
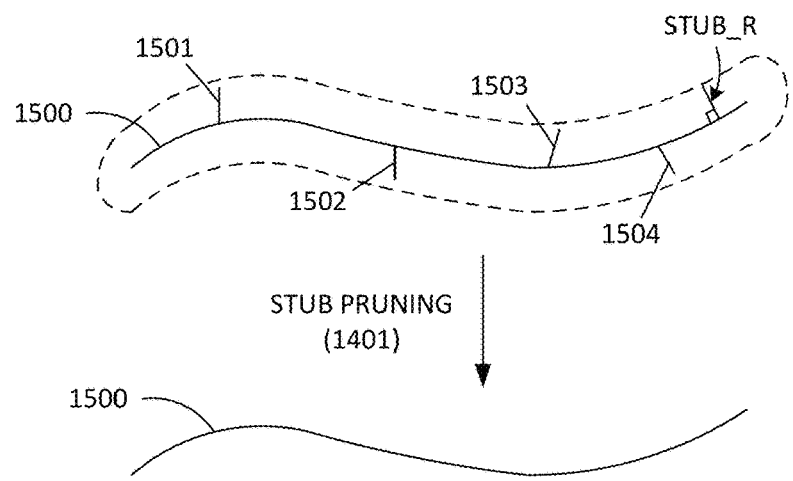
FIG. 15 is a top view illustrating a method for pruning stubs of a skeleton structure in accordance with one step of the method of FIG. 14.

In step 1401, skeleton stub pruning is implemented. FIG. 15 illustrates a possible skeleton structure configuration that may be improved by stub pruning step 1401. As illustrated by FIG. 15, one or more skeleton stubs 1501-1504 extend away from a main skeleton line 1500. A stub radius value (STUB_R), which defines a minimum allowable length of a stub extending from the main skeleton line 1500, is selected. Any skeleton stub that does not extend at least the stub radius value (STUB_R) from the main skeleton line 1500 is eliminated. In the example illustrated by FIG. 15, each of the skeleton stubs 1501-1504 does not extend away from the main skeleton line 1501 by at least the stub radius value (STUB_R). Therefore, these skeleton stubs 1501-1504 are eliminated from the skeleton structure by the skeleton stub pruning step 1401.

Figure 16:
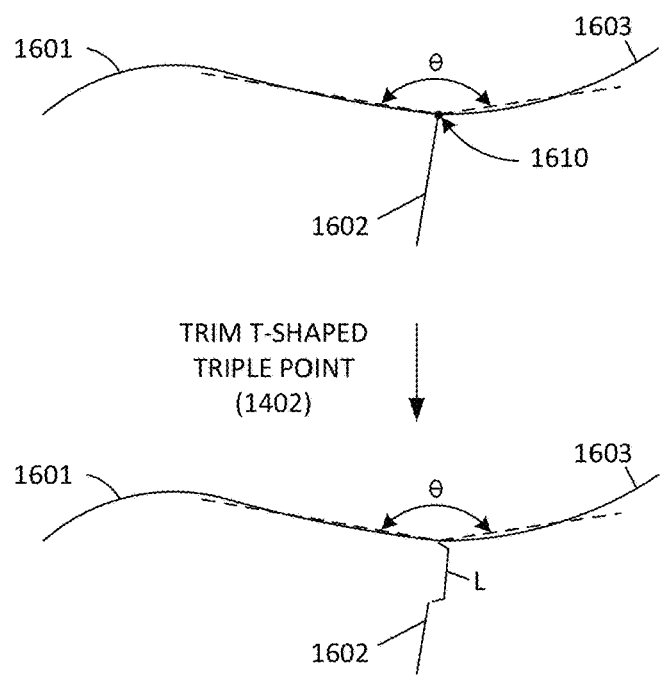
FIG. 16 is a top view illustrating a method for trimming T-shaped triple points of a skeleton structure in accordance with one step of the method of FIG. 14.

In step 1402, T-shaped triple points of a skeleton structure are trimmed. As illustrated by FIG. 16, a triple point 1610 is formed by the junction of three skeleton segments 1601-1603. The triple point 1610 is determined to be "T-shaped" if the largest angle formed by the three skeleton segments 1601-1603 exceeds a predetermined minimum angle (e.g., 140°). In the illustrated example, the angle θ formed between skeleton segments 1601 and 1603 is greater than the predetermined minimum angle of 140°, such that the triple point 1610 is identified as a T-shaped triple point. In accordance with one embodiment, the skeleton segment 1602 that is not included in the large angle θ of the T-shaped triple point 1610 is trimmed back from the triple point 1601 by a length (L), thereby eliminating the triple point. In one embodiment, the length (L) trimmed from the skeleton segment 1602 is selected in response to the orientation of the trimmed skeleton segment 1602 to the untrimmed skeleton segments 1601 and 1603. The length (L) is selected to ensure an adequate spacing between the end of the trimmed skeleton segment 1602 and the untrimmed skeleton segments 1601 and 1603.

Figure 17:
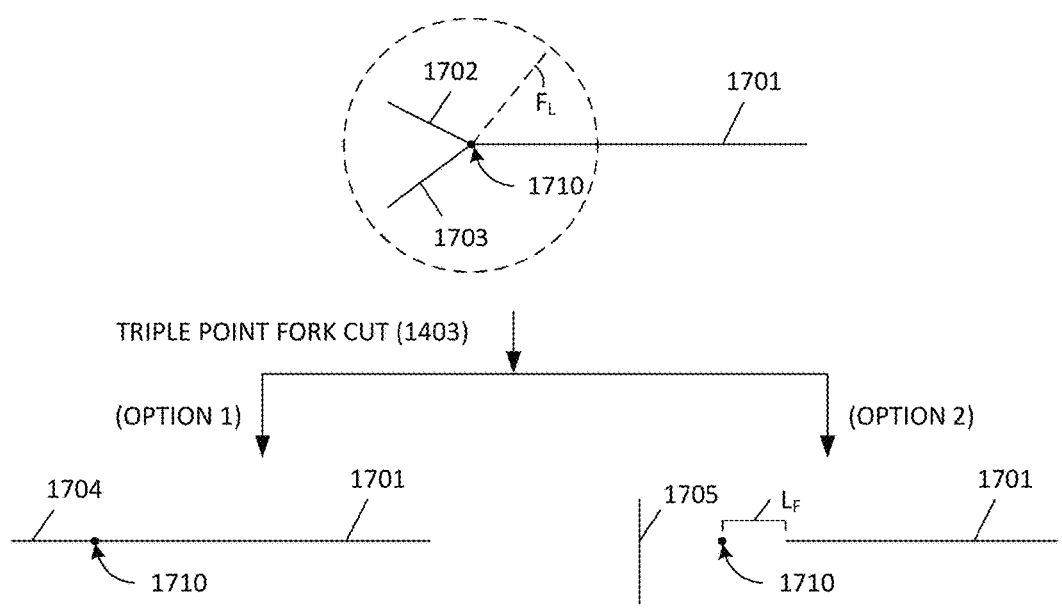
FIG. 17 is a top view illustrating a method for cutting triple-point fork skeleton structures in accordance with one step of the method of FIG. 14.

In step 1403, triple point forks of a skeleton structure are cut. As illustrated by FIG. 17, a triple point 1710 is formed by the junction of three skeleton segments 1701-1703. Two of the skeleton segments 1702-1703 of the triple point 1710 are shorter than a predefined fork length ($F_L$), and one of the skeleton segments 1701 is longer than the predefined fork length ($F_L$). Under these conditions, triple-point 1710 is defined as a 'forked' triple point. The forked triple point 1710 can be eliminated (cut) using one of two options. In a first option, the shorter skeleton segments 1702-1703 are merged into a single skeletons segment 1704, which is continuous with the longer skeleton segment 1701. In one embodiment, the merged skeleton segment 1704 extends along the center line of the longer skeleton segment 1701. In a second option, the shorter skeleton segments 1702-1703 are replaced with a separate skeleton segment 1705, which generally extends between the ends of the original skeleton segments 1702-1703, and the longer skeleton segment is shortened by a distance $L_F$ (from the triple point 1710). Although triple point is shown in Options 1 and 2 of FIG. 17 for reference, it is understood that the triple point 1710 is actually eliminated in these options.

Figure 18:
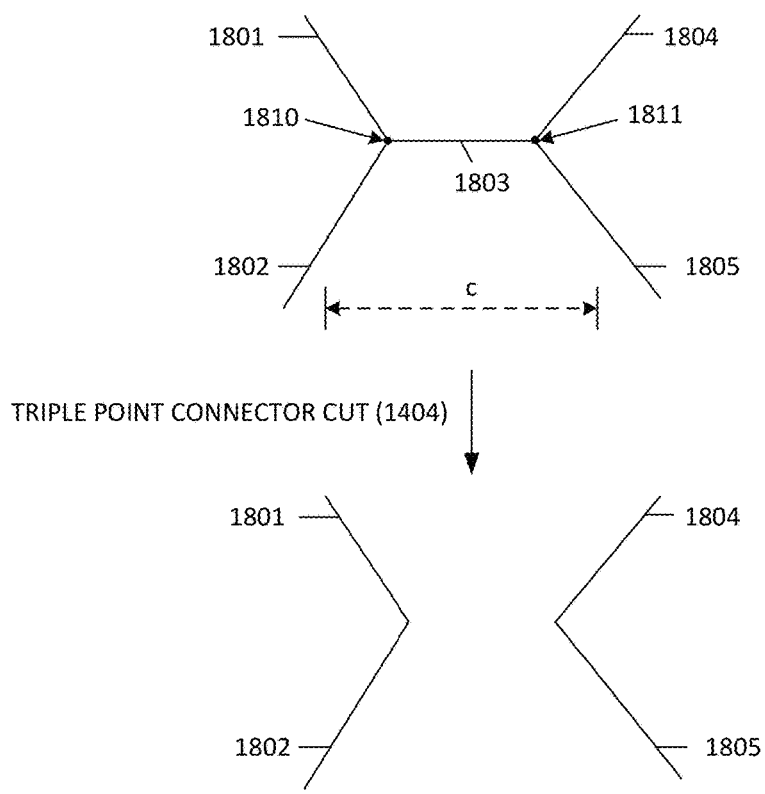
FIG. 18 is a top view illustrating a method for cutting triple-point connectors of a skeleton structure in accordance with one step of the method of FIG. 14.

In step 1404, triple point connectors are cut. As illustrated by FIG. 18, skeleton segments 1801-1803 are connected to form a first triple point 1810, and skeleton segments 1803-1805 are connected to form a second triple point 1811, wherein segment 1803 joins triple points 1810 and 1811. If the length of the connecting segment 1803 is less than a predetermined length (c), then the connecting segment 1803 is identified as a triple point connector, and is removed. In one embodiment, the remaining skeleton segments 1801-1802 and 1804-1805 may be straightened to ensure that an adequate minimum distance exists between these remaining skeleton segments.

In step 1405, compact triple points are adjusted. As illustrated by FIG. 19, skeleton segments 1901-1903 are connected to form a triple point 1910, wherein each of the skeleton segments has a length less than a predetermined compact radius value $R_C$. Under these conditions, triple point 1910 is defined as a 'compact' triple point. The compact triple point 1910 is eliminated by replacing the skeleton segments 1901-1903 with a small square 1911 having a center at the location of the triple point 1910, and a predetermined edge length $L_E$.

In step 1406, quad points are adjusted. As illustrated by FIG. 20, skeleton segments 2001-2004 are connected to form a quad point 2010, wherein each of the segments 2001-2004 has a length greater than a predetermined minimum length. Quad point 2010 is eliminated by replacing the quad point 2010 with a small square 2011 having a center at the location of the quad point 2010, and a predetermined edge length $L_E$. In addition, each of the skeleton segments 2001-2004 is retracted from the box 2011 by a predetermined distance $D_R$, which is selected to ensure an adequate spacing exists between the square 2011 and the remaining portions of skeleton segments 2001-2004.

Figure 21:
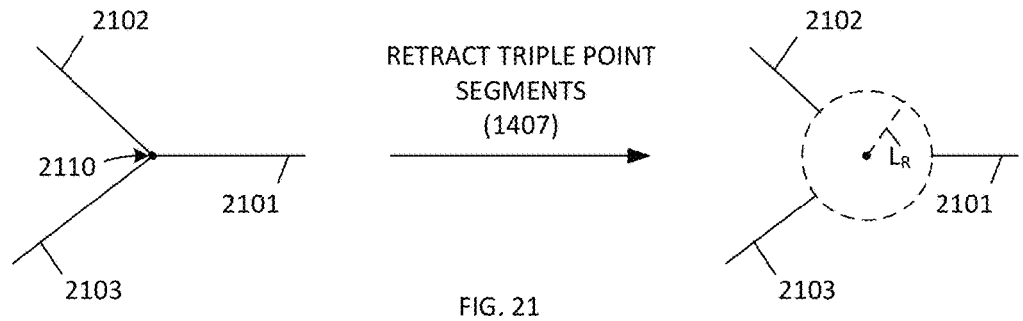
FIG. 21 is a top view illustrating a method for retracting all segments of a triple-point skeleton structure in accordance with one step of the method of FIG. 14.

In step 1407, all segments of a triple point are retracted. As illustrated by FIG. 21, skeleton segments 2101-2103 are connected to form a triple point 2110, wherein each of the segments 2101-2103 has a length greater than a predetermined minimum length. Triple point 2110 is eliminated by retracting each of the skeleton segments by a length $L_R$ from the triple point 2110. The length $L_R$ is selected to ensure that subsequently formed skeleton polygons are separated at the location near triple point 2110.

Figure 22:
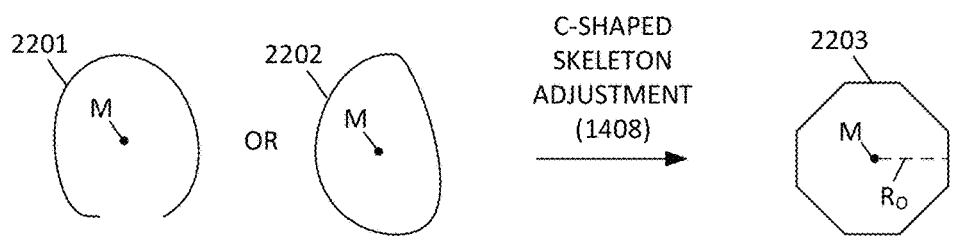
FIG. 22 is a top view illustrating a method for processing c-shaped skeleton segments in accordance with one step of the method of FIG. 14.

In step 1408 small open or closed loop skeleton structures are replaced with an octagon. As illustrated by FIG. 22, a C-shaped skeleton feature 2201 having a center of mass M (or a small closed loop skeleton feature 2202 having a center of mass M) and a perimeter of less than a predetermined length is replaced with an octagon 2203 having a predetermined radius $R_O$ from the center of mass M.

Figure 23:
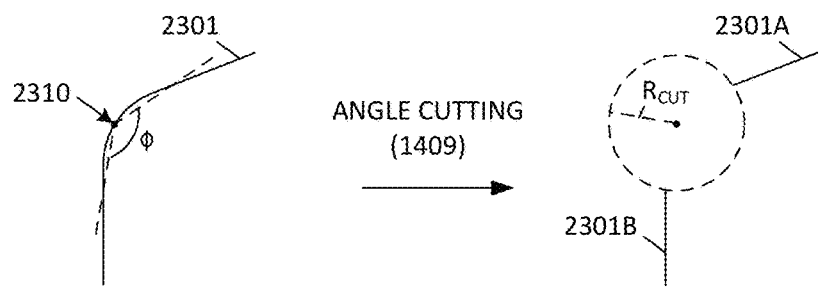
FIG. 23 is a top view illustrating a method for cutting angled skeleton structures in accordance with one step of the method of FIG. 14.

In step 1409, a skeleton structure exhibiting an angle less than a predetermined angle is cut back. As illustrated by FIG. 23, a skeleton structure 2301 having a vertex point 2310 and an associated angle φ less than a predetermined minimum angle (e.g., 110 degrees) is identified. In response, the skeleton structure 2301 is cut back from the vertex point 2310, resulting in the formation of two separate segments 2301A and 2301B. The cut back is performed by a radius $R_{CUT}$ from the location of the vertex point 2310. The radius $R_{CUT}$ is selected to ensure that adequate spacing exists between the subsequently formed skeleton polygons associated with skeleton segments 2301A and 2301B.

Figure 24:
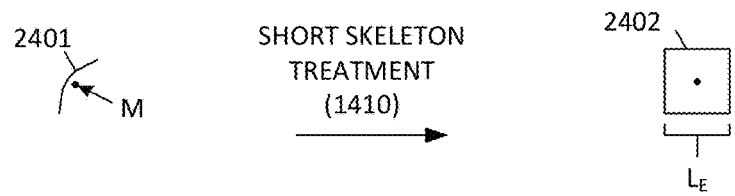
FIG. 24 is a top view illustrating a method for modifying short skeleton structures in accordance with one step of the method of FIG. 14.

In step 1410, a short skeleton segment is replaced with a square. As illustrated by FIG. 24, a skeleton segment 2401 having a length less than a predetermined length and a center of mass M is replaced by a square 2402 centered at the center of mass M, and having a predetermined edge length $L_E$.

Figure 25:
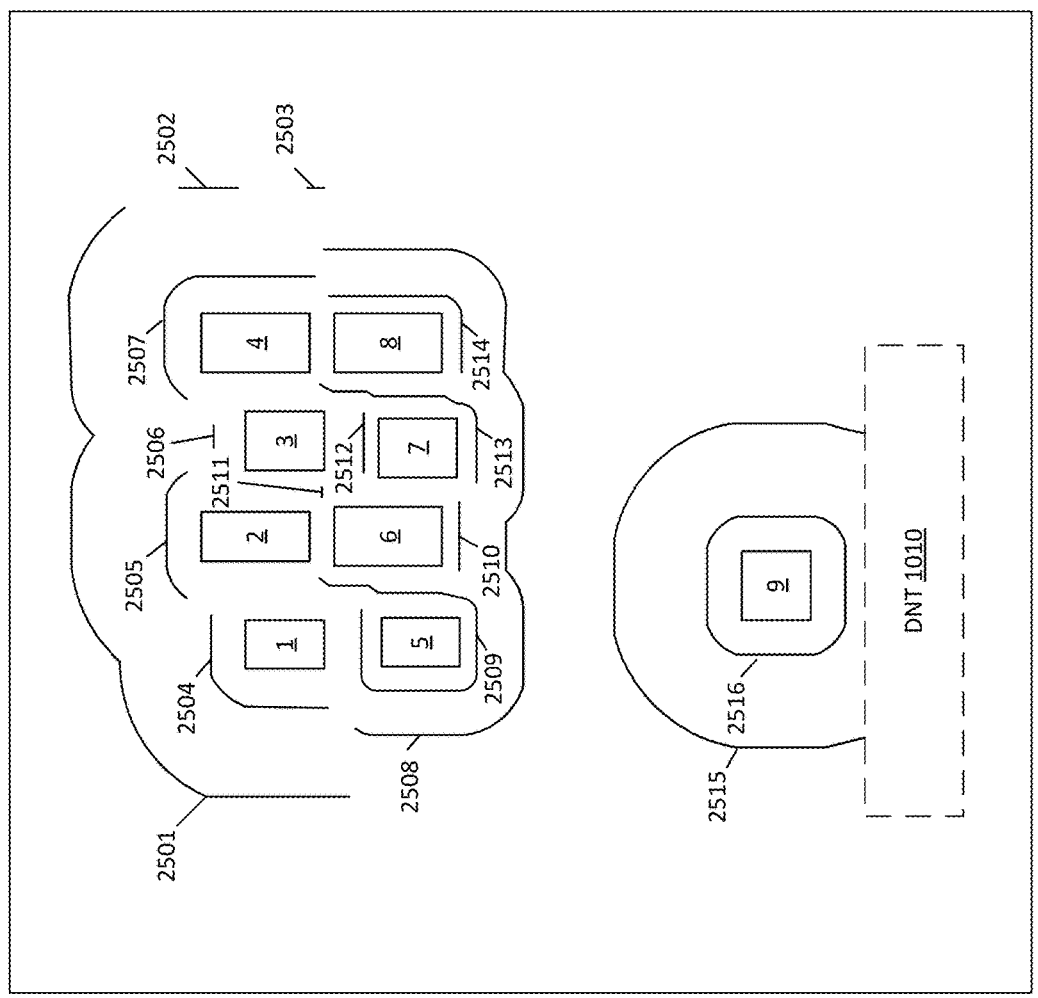
FIG. 25 is a top view of the re-skeletonized seed skeletons of FIG. 13, after the cleaning method of FIG. 14 is applied to these seed skeletons in accordance with one embodiment of the present invention.

FIG. 25 is a top view of cleaned skeleton structures 2501-2516, which remain after the conflict resolution process of step 305 (which includes cleaning steps 1401-1410 of FIG. 14) is applied to the skeleton structures 1301-1306 of FIG. 13, in accordance with one embodiment of the present invention.

Figure 26:
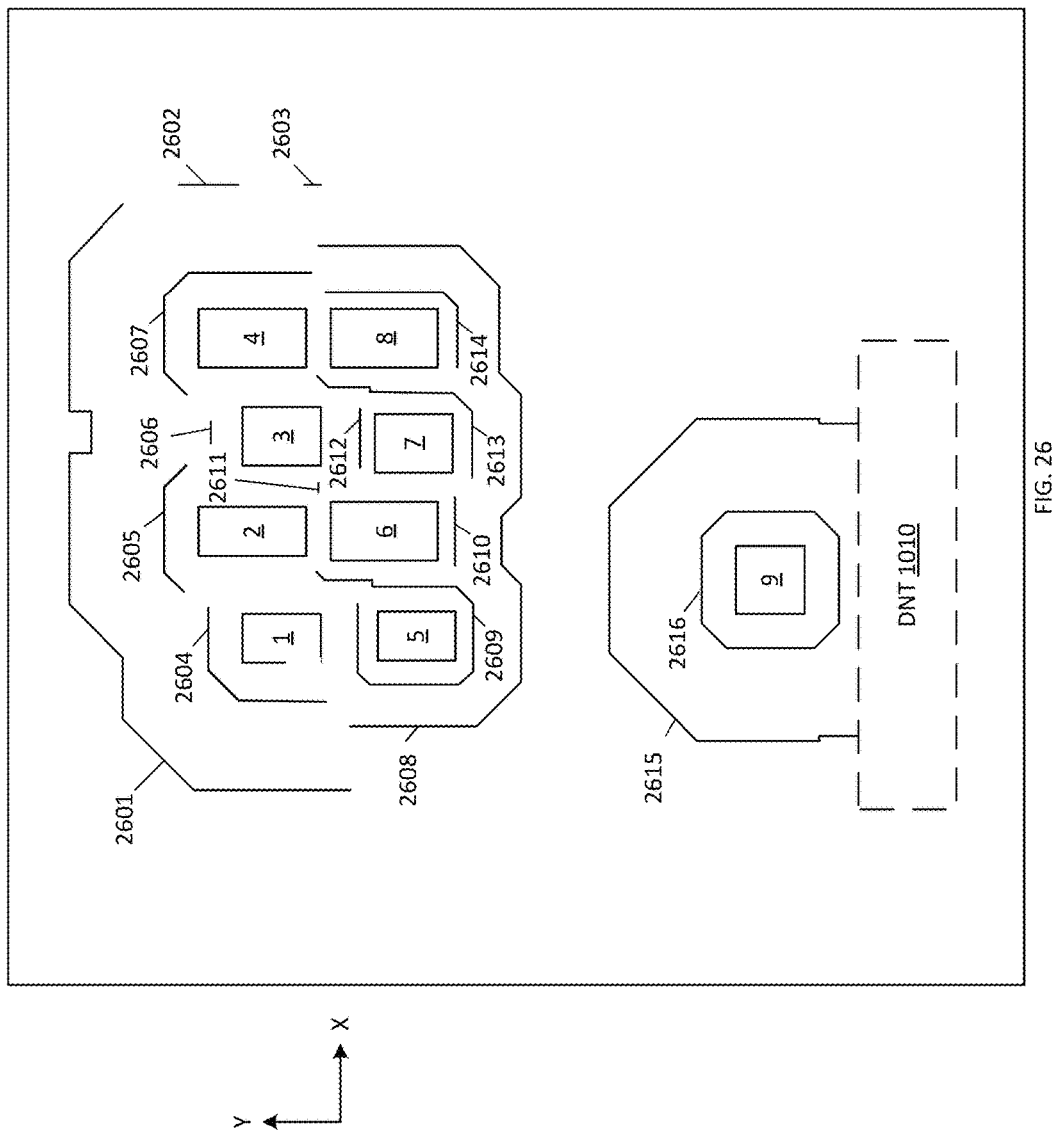
FIG. 26 is a top view of the cleaned seed skeletons of FIG. 25, after these cleaned seed skeletons have been straightened in accordance with one embodiment of the present invention.

The cleaned skeleton structures 2501-2516 are then straightened (FIG. 3, Step 306). FIG. 26 is a top view illustrating straightened skeleton structures 2601-2616, which result from straightening the cleaned skeleton structures 2501-2516 of FIG. 25. In general, the straightening process is implemented by aligning (fitting) the lines of the cleaned skeleton structures 2501-2516 with the X-axis, the Y-axis, or at 45 degree angles with respect to the X and Y axes. This alignment can be performed using various statistical methods, including, but not limited to, a least squares function.

Polygons (e.g., rectangles) are then placed along the straightened skeletons 2601-2616, thereby providing the final SRAFs (FIG. 3, Step 307). FIG. 27 is a top view illustrating polygonal SRAFs 2700, which result from placing polygons along the straightened skeleton structures 2601-2616 of FIG. 26. Note that the widths of the polygon SRAFs 2700 are selected in view of the associated illumination scheme, and may be specified by the 2D RBAF rules tables.

The polygonal SRAFs 2700, along with the target polygons 1-9 are then printed on a photomask (FIG. 3, Step 308). In one embodiment, the pattern illustrated by FIG. 27 may represent a printed photomask 2701 in accordance with one embodiment of the present invention.

As described above in connection with FIG. 10, the empty space surrounding the target features is divided into owned regions, wherein each of the target features has a corresponding owned region. However, in accordance with another embodiment of the present invention, the empty space surrounding the target features is divided into owned regions based on edges of the target features, wherein each edge of a target feature may have a corresponding owned region. This concept is illustrated by FIGS. 28A and 28B.

Figure 28A:
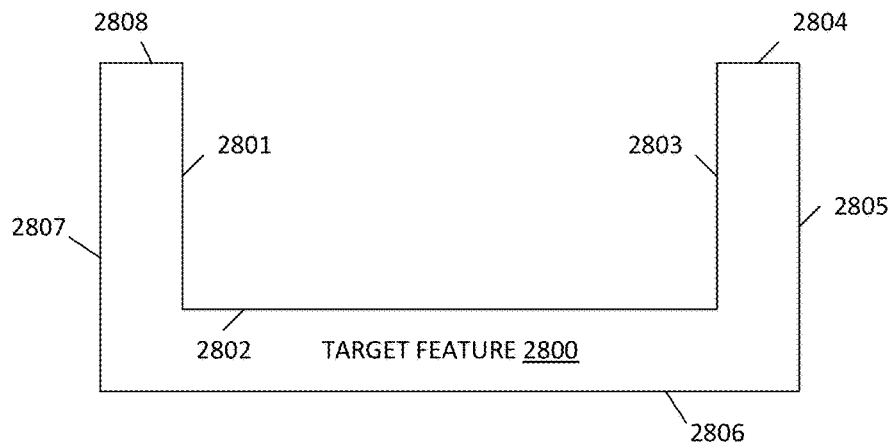
FIG. 28A is a top view of target feature that includes a plurality of target edges.
Figure 28B:
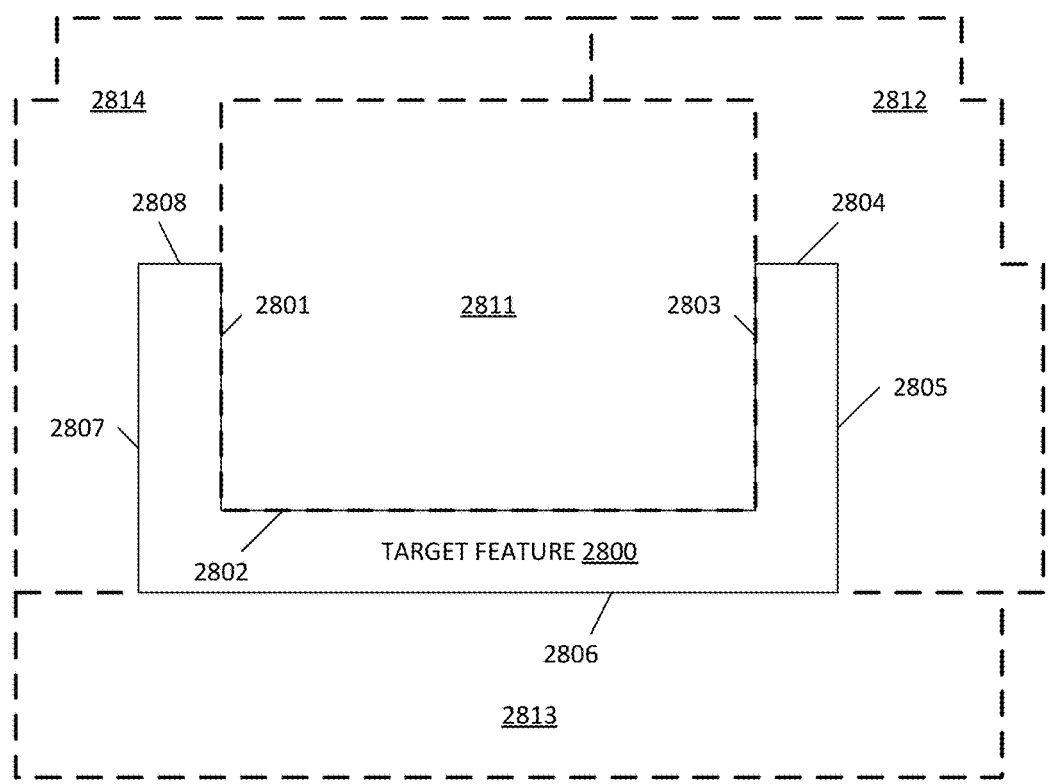
FIG. 28B is a top view of the target feature of FIG. 28A, wherein the area surrounding the target feature is divided into a plurality of owned regions based on groups of one or more target edges, in accordance with one embodiment of the present invention.

FIG. 28A is a top view of target feature 2800 that includes target edges 2801-2808. FIG. 28B is a top view of target feature 2800, wherein the area surrounding target feature 2800 is divided into a plurality of owned regions 2811-2814 (Step 303). Note that the function that determines the owned regions may be specified by a user to provide the best results for the particular shape of the target feature 2800. In the illustrated example, there are four different groups of target edges, wherein the first group includes target edges 2801-2803, the second group includes target edges 2804-2805, the third group includes target edge 2806, and the fourth group includes target edges 2807-2808. Each of the four groups of target edges has a corresponding owned region. Thus, target edges 2801-2803 are assigned a corresponding owned region 2811, target edges 2804-2805 are assigned a corresponding owned region 2812, target edge 2806 is assigned a corresponding owned region 2813, and target edges 2807-2808 are assigned a corresponding owned region 2814. Each of the four groups of target edges has its own corresponding 2D RBAF rules table, such that different edges of target feature 2800 may have different 2D RBAF rules tables. Note that the different owned regions may be associated with different numbers of associated target edges. Thus, owned region 2813 is associated with a single target edge 2806, owned regions 2812 and 2814 are each associated with two target edges 2804-2805 and 2807-2808, respectively, and owned region 2811 is associated with three target edges 2801-2803. This advantageously provides flexibility in defining the SRAFs to be introduced around the target feature 2800. In an alternate embodiment, some of the target edges of target feature 2800 are not associated with the surrounding owned regions. For example, in one embodiment, target edge 2802 may be associated with owned region 2811, while target edges 2801 and 2803 are ignored for purposes of generating seed skeletons within owned region 2811. Note that "do not touch" (DNT) regions, similar to those described above, can be included within the owned regions 2811-2814.

Once the owned regions 2811-2814 have been defined, processing proceeds in the same manner described above in accordance with the method 300 of FIG. 3, wherein seed skeletons are placed in the owned regions (from the associated target edges) (Step 304), the seed skeletons are processed to resolve conflicts (Step 305), the skeletons are straightened (Step 306), polygonal SRAFs are added at locations specified by the straightened skeletons (Step 307), and the polygonal SRAFs are printed on a photomask (Step 308). Note that SRAFs associated with a target edge (or group of target edges) are not allowed to encroach into owned regions associated with other target edges (or groups of target edges), greatly simplifying the placement of the SRAFs by eliminating the crossing of SRAFs across the boundaries of the owned regions.

The SRAF placement method 300 of the present invention exhibits several advantages with respect to the conventional rules-based SRAF placement methods and conventional model-based SRAF placement methods. First, the speed of the SRAF placement method 300 of the present invention is comparable to the speed of a conventional rules-based SRAF placement method, and several orders of magnitude faster than the speed of a conventional model-based SRAF placement method. The results provided by the SRAF placement method 300 of the present invention are substantially better than the results provided by a conventional rules-based SRAF placement method, because the 2D RBAF rules tables of method 300 allow for the fabrication of SRAFs that are more complex than those available in a conventional rules-based SRAF placement method.

In fact, the SRAF placement method 300 of the present invention closely approximates the results achieved by a conventional model-based SRAF placement method. Moreover, because the SRAF placement method 300 of the present invention is purely geometry driven, the results provided by this method 300 are more consistent than the results provided by a conventional model-based SRAF placement method. In addition, the SRAF placement method 300 of the present invention provides polygonal SRAFs that are more easily printed on a photomask than the irregularly shaped SRAFs of a conventional model-based SRAF placement method.

Furthermore, the SRAF placement method 300 of the present invention defines the 2D RBAF rules tables using polar coordinates, which more naturally approximates the lithographically driven optimal solution. Moreover, the owned region division and skeleton-based network processing implemented by the SRAF placement method 300 are much more natural for typical assist features, which are usually narrow and may follow non-rectilinear paths. The SRAF placement method 300 of the present invention may also be used to define SRAFs for newer designs, such as those created by directed self assembly (DSA), which typically include curvilinear patterns having many small all angle edges that are difficult for conventional RBAF methods to handle (for reasons provided above).

Figure 29:
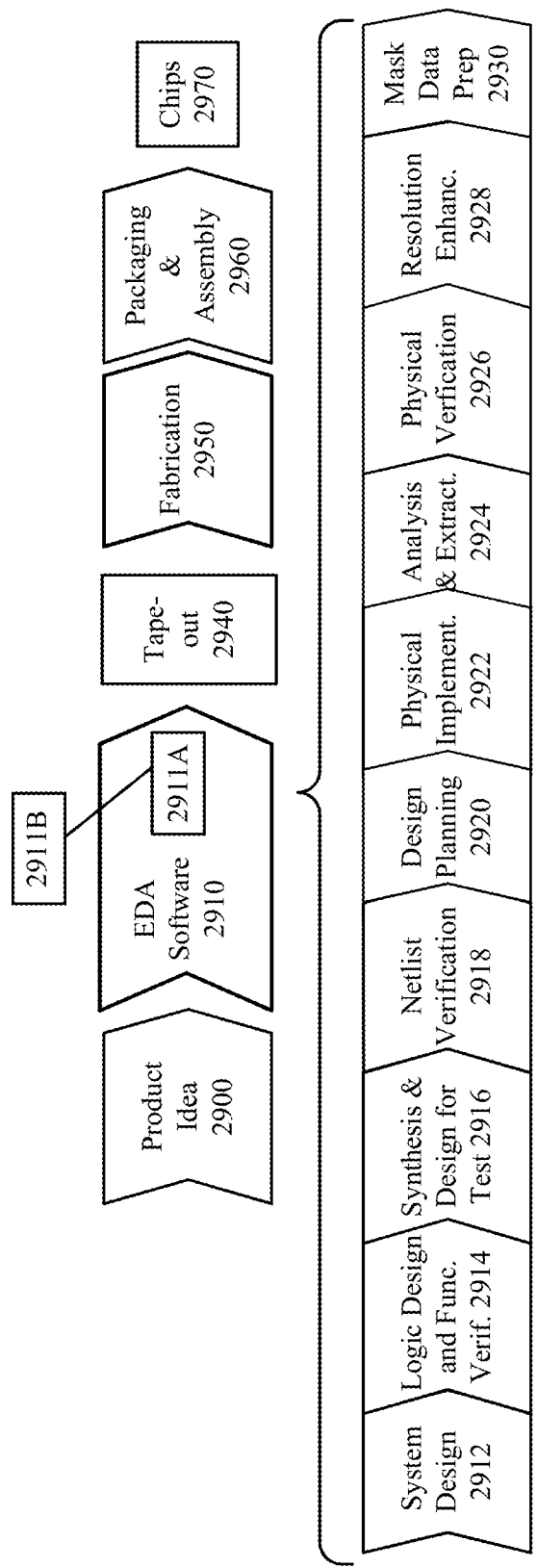
FIG. 29 is a block diagram of a simplified representation of an exemplary digital ASIC design flow including the processes for generating polygonal SRAFs using 2D RBAF rules tables in accordance with the present invention.

FIG. 29 is a block diagram of a simplified representation of an exemplary digital ASIC design flow including the processes for generating polygonal SRAFs using 2D RBAF rules tables in accordance with the method 300 described above. At a high level, the process starts with the product idea (step 2900) and is realized in an EDA software design process (step 2910). When the design is finalized, it can be taped-out (event 2940). After tape out, the fabrication process (step 2950) and packaging and assembly processes (step 2960) occur resulting, ultimately, in finished chips (result 2970). In accordance with various embodiments, the generation of polygonal SRAFs using 2D RBAF rules tables in accordance with the method 300 described above can be implemented in the EDA software design process (step 2910).

The EDA software design process (step 2910) is actually composed of a number of steps 2912-2930, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components/steps of the EDA software design process (step 2910) will now be provided. In one embodiment, one or more steps of the EDA software design process can be implemented using a computer-readable medium 2911A, which is read by a computer 2911B. Note that Astro, AstroRail, CustomSim, ESP, Hercules, IC Compiler, Magellan, Model Architect, Power Compiler, PrimeRail, Proteus, ProteusAF, PSMGen, Saber, StarRC, and System Studio are trademarks of Synopsys, Inc., and CATS, DesignWare, Design Compiler, Formality, HSIM, Leda, NanoSim, Primetime, Syndicated, TetraMAX, VCS, and Vera are registered trademarks of Synopsys, Inc. System design (step 2912): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect™, Saber™, System Studio™, and DesignWare® products.

Logic design and functional verification (step 2914): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include HSIM®, NanoSim®, CustomSim™, VCS®, VERA®, DesignWare®, Magellan™, Formality®, ESP™ and LEDA® products.

Synthesis and design for test (step 2916): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler™, Tetramax®, and DesignWare® products.

Netlist verification (step 2918): At this step, the netlist is checked for compliance with timing constraints and for correspondence with the VHDL/Verilog source code. Exemplary EDA software products from Synopsys, Inc. that can be used at this step include Formality®, PrimeTime™, and VCS® products.

Design planning (step 2920): Here, an overall floorplan for the chip is constructed and analyzed for timing and top-level routing. Exemplary EDA software products from Synopsys, Inc. that can be used at this step include Astro™ and IC Compiler™ products.

Physical implementation (step 2922): The placement (positioning of circuit elements) and routing (connection of the same) occurs at this step. Exemplary EDA software products from Synopsys, Inc. that can be used at this step include the Astro™ and IC Compiler™ products.

Analysis and extraction (step 2924): At this step, the circuit function is verified at a transistor level, this in turn permits what-if refinement. Exemplary EDA software products from Synopsys, Inc. that can be used at this step include AstroRail™, PrimeRail™, Primetime®, and Star RC/XT™ products.

Physical verification (step 2926): At this step various checking functions are performed to ensure correctness for: manufacturing, electrical issues, lithographic issues, and circuitry. Exemplary EDA software products from Synopsys, Inc. that can be used at this step include the Hercules™ product.

Resolution enhancement (step 2928): This step involves geometric manipulations of the layout to improve manufacturability of the design. In accordance with one embodiment of the present invention, the above-described method 300 for generating polygonal SRAFs is implemented during the resolution enhancement step 2928. Exemplary EDA software products from Synopsys, Inc. that can be used at this step include Proteus™, ProteusAF™, and PSMGen™ products. In accordance with one embodiment, a computer readable medium 2911A stores instructions, which when executed by a processor 2911B, will implement the above-described method 300 for generating polygonal SRAFs using 2D RBAF rules tables.

Mask data preparation (step 2930): This step provides the "tape-out" data for production of masks for lithographic use to produce finished chips. Photomasks including the polygonal SRAFs of the present invention are fabricated during this data mask preparation step 2930. Exemplary EDA software products from Synopsys, Inc. that can be used at this step include the CATS® family of products.

Although illustrative embodiments of the invention have been described in detail herein with reference to the accompanying figures, it is to be understood that the invention is not limited to those precise embodiments. Thus, the scope of the invention is defined by the following claims and their equivalents.

I claim:

1. A method for generating a photomask that includes sub-resolution assist features (SRAFs) for target features comprising:

dividing an area surrounding a target feature into a plurality of owned regions, wherein the target feature includes a plurality of target edges, and each of the plurality of owned regions is associated with at least one of the target edges;

within each of the owned regions, generating a seed skeleton based on a corresponding 2-dimensional (2D) rules table that specifies distances and angles from the associated at least one of the target edges to points of the seed skeleton, wherein the 2D rules table is generated by generating model-based SRAFs based on the target features, averaging one or more characteristics of the model-based SRAFs to create a symmetrical pattern of SRAFs, and using the symmetrical pattern of SRAFs to specify the distances and angles of the 2D rules table; and placing polygonal SRAFs on the photomask based on the seed skeleton generated within each of the owned regions.

2. The method of claim 1, wherein within each of the owned regions, the generated seed skeleton extends at least partially around the associated at least one of the target edges.

3. The method of claim 1, wherein the 2D rules table further specifies an interaction radius that defines a minimum distance between adjacent seed skeletons.

4. The method of claim 1, wherein the 2D rules table further specifies a scaling factor applied to the distances.

5. The method of claim 1, wherein a 2D rules table associated with a first one of the owned regions is different than a 2D rules table associated with a second one of the owned regions.

6. The method of claim 1, wherein the 2D rules table further specifies a rectangular strength parameter that controls a rectangular shape of the seed skeleton.

7. The method of claim 1, further comprising processing the seed skeletons of the different owned regions to resolve conflicts between these seed skeletons.

8. The method of claim 1, wherein the polygonal SRAFs associated with each of the owned regions do not encroach into another one of the owned regions.

9. A method for generating a photomask that includes sub-resolution assist features (SRAFs) for target features comprising:

dividing an area surrounding a target feature into a plurality of owned regions, wherein the target feature includes a plurality of target edges, and each of the plurality of owned regions is associated with at least one of the target edges;

within each of the owned regions, generating a seed skeleton based on a corresponding 2-dimensional (2D) rules table that specifies distances and angles from the associated at least one of the target edges to points of the seed skeleton;

processing the seed skeletons of the different owned regions to resolve conflicts between these seed skeletons, wherein processing the seed skeletons comprises:

widening each of the seed skeletons to create widened seed skeletons, wherein at least two of the widened seed skeletons come into contact as a result of the widening;

re-skeletonizing the widened seed skeletons to create re-skeletonized seed skeletons; and modifying the re-skeletonized seed skeletons; and placing polygonal SRAFs on the photomask based on the modified seed skeletons.

10. The method of claim 9, wherein each of the seed skeletons is widened by an amount specified by an interaction radius parameter of the 2D rules table that defines a minimum distance between adjacent seed skeletons.

11. The method of claim 9, wherein modifying the re-skeletonized seed skeletons comprises removing stubs that extend less than a first radius from main lines of the re-skeletonized seed skeletons.

12. The method of claim 9, wherein modifying the re-skeletonized seed skeletons comprises:

identifying a triple point where a first seed skeleton segment, a second seed skeleton segment and a third seed skeleton segment meet, wherein the first seed skeleton segment and the second seed skeleton segment form an angle greater than a first angle; and trimming the third seed skeleton segment away from the triple point.

13. The method of claim 9, wherein modifying the re-skeletonized seed skeletons comprises:

identifying a fork where a first seed skeleton segment, a second seed skeleton segment and a third seed skeleton segment meet, wherein the first seed skeleton segment and the second seed skeleton segment are shorter than a first length; and replacing the first seed skeleton segment and the second seed skeleton segment with a fourth seed skeleton segment continuous with the third seed skeleton segment.

14. The method of claim 9, wherein modifying the re-skeletonized seed skeletons comprises:

identifying a fork where a first seed skeleton segment, a second seed skeleton segment and a third seed skeleton segment meet, wherein the first seed skeleton segment and the second seed skeleton segment are shorter than a first length; and replacing the first seed skeleton segment and the second seed skeleton segment with a fourth seed skeleton segment spaced apart from the third seed skeleton segment.

15. The method of claim 9, wherein modifying the re-skeletonized seed skeletons comprises:

identifying a first seed skeleton segment having a first end connected to a second seed skeleton segment and a third seed skeleton segment at a first triple point, and a second end connected to a fourth seed skeleton segment and a fifth seed skeleton segment at a second triple point; and eliminating the first seed skeleton segment.

16. The method of claim 9, wherein modifying the re-skeletonized seed skeletons comprises:

identifying a triple point where a first seed skeleton segment, a second seed skeleton segment and a third seed skeleton segment meet, wherein the first, second and third seed skeleton segments are all shorter than a first length; and replacing the first, second and third seed skeleton segments with a square centered at the triple point.

17. The method of claim 9, wherein modifying the re-skeletonized seed skeletons comprises:

identifying a quad point where a first seed skeleton segment, a second seed skeleton segment, a third seed skeleton segment and a fourth seed skeleton segment meet;

placing a square at the quad point; and retracting the first, second, third and fourth seed skeletons segments from the square.

18. The method of claim 9, wherein modifying the re-skeletonized seed skeletons comprises:

identifying a triple point where a first seed skeleton segment, a second seed skeleton segment and a third seed skeleton segment meet; and retracting each of the first, second and third seed skeleton segments from the triple point.

19. The method of claim 9, wherein modifying the re-skeletonized seed skeletons comprises:

identifying a seed skeleton segment that substantially laterally surrounds a center of mass and has a perimeter less than a first length; and replacing the seed skeleton segment with an octagon centered at the center of mass.

20. The method of claim 9, wherein modifying the re-skeletonized seed skeletons comprises:

identifying a seed skeleton segment having a vertex point and a corresponding angle less than a first angle; and removing portions of the seed skeleton segment around the vertex point.

21. The method of claim 9, wherein modifying the re-skeletonized seed skeletons comprises:

identifying a seed skeleton segment having a center of mass and a length less than a first length; and replacing the seed skeleton segment with a square centered at the center of mass.

22. A method for generating a photomask that includes sub-resolution assist features (SRAFs) for target features comprising:

dividing an area surrounding a target feature into a plurality of owned regions, wherein the target feature includes a plurality of target edges, and each of the plurality of owned regions is associated with at least one of the target edges;

within each of the owned regions, generating a seed skeleton based on a corresponding 2-dimensional (2D) rules table that specifies distances and angles from the associated at least one of the target edges to points of the seed skeleton;

processing the seed skeletons of the different owned regions to resolve conflicts between these seed skeletons;

straightening the processed seed skeletons; and placing polygonal SRAFs on the photomask based on the straightened seed skeletons.

23. The method of claim 22, wherein the straightening comprises modifying the processed seed skeletons to include only seed skeletons segments that are located in parallel with an X-axis or a Y-axis, or at a 45 degree angle with respect to the X and Y axes.

* * * * *